(12) United States Patent
Seong et al.

(10) Patent No.: US 10,026,809 B1
(45) Date of Patent: Jul. 17, 2018

(54) SEMICONDUCTOR DEVICE

(71) Applicant: Samsung Electronics Co., Ltd., Suwon-si, Gyeonggi-do (KR)

(72) Inventors: GeumJung Seong, Seoul (KR); JeongYun Lee, Yongin-si (KR); SeungSoo Hong, Incheon (KR); KyungSeok Min, Yongin-si (KR); SeungJu Park, Hwaseong-si (KR); Youngmook Oh, Hwaseong-si (KR); Bora Lim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/662,248

(22) Filed: Jul. 27, 2017

(30) Foreign Application Priority Data

Dec. 22, 2016 (KR) ........................ 10-2016-0177019

(51) Int. Cl.
| | | |
|---|---|---|
| H01L 29/76 | (2006.01) | |
| H01L 29/06 | (2006.01) | |
| H01L 21/8234 | (2006.01) | |
| H01L 21/764 | (2006.01) | |
| H01L 27/088 | (2006.01) | |
| H01L 29/08 | (2006.01) | |
| H01L 23/535 | (2006.01) | |

(52) U.S. Cl.
CPC ........ *H01L 29/0653* (2013.01); *H01L 21/764* (2013.01); *H01L 21/823425* (2013.01); *H01L 21/823431* (2013.01); *H01L 21/823475* (2013.01); *H01L 21/823481* (2013.01); *H01L 23/535* (2013.01); *H01L 27/0886* (2013.01); *H01L 29/0847* (2013.01)

(58) Field of Classification Search
CPC ......... H01L 27/0886; H01L 21/823431; H01L 21/823475; H01L 21/823481; H01L 29/0847; H01L 23/535
USPC ........................................................ 257/382
See application file for complete search history.

(56) References Cited

U.S. PATENT DOCUMENTS

| | | | |
|---|---|---|---|
| 8,809,139 B2 * | 8/2014 | Huang | ............ H01L 21/823807 257/E21.176 |
| 8,921,191 B2 | 12/2014 | Cai et al. | |
| 9,147,682 B2 | 9/2015 | Ching et al. | |
| 9,324,713 B1 | 4/2016 | Yu et al. | |
| 9,337,306 B2 | 5/2016 | Peng et al. | |

(Continued)

*Primary Examiner* — Luan C Thai
(74) *Attorney, Agent, or Firm* — Renaissance IP Law Group LLP

(57) ABSTRACT

Active patterns protrude from a substrate. The active patterns include a first active pattern, a second active pattern spaced apart from the first active pattern at a first distance, and a third active pattern spaced apart from the second active pattern at a second distance greater than the first distance. A gate spacer is disposed on sidewalls of a gate electrode running across the active patterns. Source/drain regions include a first to a third source/drain regions disposed on a region of one of the active patterns. The region of one of the active patterns is disposed adjacent to a side of the gate electrode. First and second protective insulation patterns are disposed on the substrate between the first and second active patterns below the first and second source/drain regions and between the second and third active patterns below the second and third source/drain regions, respectively.

20 Claims, 24 Drawing Sheets

(56) References Cited

U.S. PATENT DOCUMENTS

| | | |
|---|---|---|
| 9,412,731 B2 * | 8/2016 | Kim .................... H01L 27/0207 |
| 9,431,478 B2 | 8/2016 | Jeong et al. |
| 2014/0217517 A1 | 8/2014 | Cai et al. |
| 2015/0108544 A1 | 4/2015 | Ching et al. |
| 2015/0287711 A1 * | 10/2015 | Kim .................... H01L 27/0207 257/344 |
| 2015/0318399 A1 | 11/2015 | Jeong et al. |
| 2015/0380515 A1 | 12/2015 | Peng et al. |
| 2016/0111542 A1 | 4/2016 | Zhang et al. |

* cited by examiner

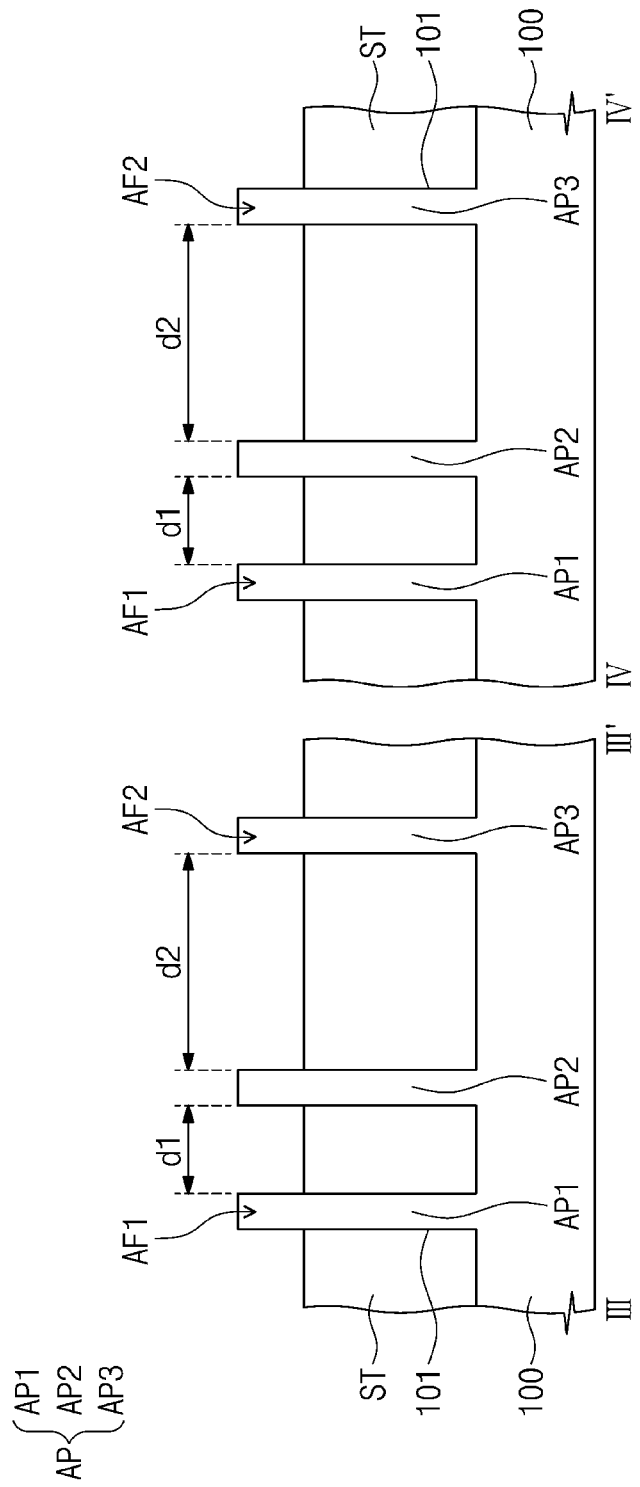

SEMICONDUCTOR DEVICE

CROSS-REFERENCE TO RELATED APPLICATION

This application claims priority under 35 U.S.C § 119 of Korean Patent Application No. 10-2016-0177019, filed on Dec. 22, 2016 in the Korean Intellectual Property Office, the disclosure of which is incorporated by reference herein in its entirety.

TECHNICAL FIELD

The present inventive concept relates to a semiconductor device.

DISCUSSION OF RELATED ART

Semiconductor devices include integrated circuits in which metal oxide semiconductor field effect transistors (MOSFETs) are connected to each other to perform various operations of the semiconductor devices. As size and design rule of the semiconductor devices are gradually decreased, the sizes of the MOSFETs are also scaled down.

SUMMARY

According to an exemplary embodiment of the present inventive concept, a semiconductor device is provided as follows. A plurality of active patterns protrudes from a substrate. The plurality of active patterns includes a first active pattern, a second active pattern spaced apart from the first active pattern at a first distance, and a third active pattern spaced apart from the second active pattern at a second distance greater than the first distance. A gate electrode runs across the first to third active patterns. A gate spacer is disposed on a sidewall of the gate electrode. A plurality of source/drain regions includes a first source/drain region, a second source/drain region and a third source/drain region, each of the plurality of source/drain regions being disposed on a region of one of the plurality of active patterns. The region of one of the plurality of active patterns is disposed adjacent to a side of the gate electrode. A first protective insulation pattern is disposed on the substrate between the first and second active patterns below the first and second source/drain regions. A second protective insulation pattern is disposed on the substrate between the second and third active patterns below the second and third source/drain regions.

According to an exemplary embodiment of the present inventive concept, the first protective insulation pattern has a first thickness, and the second protective insulation pattern has a second thickness less than the first thickness.

According to an exemplary embodiment of the present inventive concept, the semiconductor device further includes a plurality of contact etch stop patterns each covering a sidewall of one of the plurality of source/drain regions. The first protective insulation pattern is connected to the gate spacer, and the second protective insulation pattern is connected to one of the plurality of contact etch stop patterns.

According to an exemplary embodiment, the first protective insulation pattern includes the same material as a material of the gate spacer, and the second protective insulation pattern includes the same material as a material of each of the plurality of contact etch stop patterns.

According to an exemplary embodiment of the present inventive concept, facing sidewalls of the first source/drain region and the second source/drain region are in contact to each other so that an air gap is disposed in a space defined by the facing sidewalls of the first source/drain region and the second source/drain region. The first protective insulation pattern is disposed under the space so that the air gap includes a bottom surface defined by the first protective insulation pattern.

According to an exemplary embodiment, the gate spacer comprises a first gate spacer and a second gate spacer that are sequentially disposed on the sidewall of the gate electrode, and the first gate spacer and the second gate spacer include different materials from each other.

According to an exemplary embodiment of the present inventive concept, the first protective insulation pattern comprises a first sub-protective insulation pattern and a second sub-protective insulation pattern that are sequentially stacked on the substrate. The first sub-protective insulation pattern includes the same material as a material of the first gate spacer. The second sub-protective insulation pattern includes the same material as a material of the second gate spacer.

According to an exemplary embodiment of the present inventive concept, the semiconductor device further includes a first source/drain contact connected in common to the first source/drain region and the second source/drain region, and a second source/drain contact connected to the third source/drain region.

According to an exemplary embodiment of the present inventive concept, a semiconductor device is provided as follows. A substrate has a device isolation pattern. A pair of a first active pattern and a second active pattern protrudes from the device isolation pattern of the substrate and is spaced apart at a first distance from each other in a first direction. A pair of gate electrodes runs across the pair of first active pattern and the second active pattern and is spaced apart from each other in a second direction crossing the first direction. A third active pattern protrudes from the device isolation pattern of the substrate and is spaced apart at a second distance from the second active pattern adjacent to the third active pattern. The second distance is greater than the first distance. A pair of gate spacers is disposed on facing sidewalls of the pair of gate electrodes, respectively. A pair of source/drain regions is disposed on the pair of first active pattern and the second active pattern, respectively, between one of the pair of gate electrodes and the other of the pair of gate electrodes. A first protective insulation pattern is disposed on the device isolation pattern between the pair of gate electrodes and between the pair of first active pattern and the second active pattern. A second protective insulation pattern is disposed on the device isolation pattern between the second active pattern and the third active pattern.

According to an exemplary embodiment of the present inventive concept, the first protective insulation pattern has a first thickness, and the second protective insulation pattern has a second thickness less than the first thickness.

According to an exemplary embodiment of the present inventive concept, the semiconductor device further includes a contact etch stop pattern covering the pair of source/drain regions. The first protective insulation pattern is connected to a lower end of each of the pair of gate spacers so that a connected structure of the first protective insulation pattern and the pair of gate spacers is of U-shaped. The second protective insulation pattern is connected to the contact etch stop pattern. The first protective insulation pattern and the second protective insulation pattern are in contact with the device isolation pattern.

According to an exemplary embodiment of the present inventive concept, one of the pair of source/drain regions and the other of the pair of source/drain regions are in contact to each other so that an air gap has a top surface defined by facing sidewalls of the pair of source/drain regions. The air gap has a bottom surface defined by the first protective insulation pattern.

According to an exemplary embodiment of the present inventive concept, each of the pair of gate spacers includes a first gate spacer and a second gate spacer that are sequentially disposed on a corresponding one of the facing sidewalls of the pair of gate electrodes. The first protective insulation pattern includes a first sub-protective insulation pattern and a second sub-protective insulation pattern that are sequentially stacked on the device isolation pattern. The first sub-protective insulation pattern includes the same material as a material of the first gate spacer, and the second sub-protective insulation pattern includes the same material as a material of the second gate spacer.

According to an exemplary embodiment of the present inventive concept, a semiconductor device is provided as follows. A device isolation pattern is disposed on a substrate. The device isolation pattern includes a first part, a second part and a third part. A first active pattern protrudes from the device isolation pattern. A second active pattern is adjacent to the first active pattern in a first direction and protruding from the device isolation pattern. A first gate structure is disposed on the substrate. A second gate structure is adjacent to the first gate structure in a second direction crossing the first direction. Each of the first active pattern and the second active pattern includes a first region and a second region. The first gate structure and the second gate structure run across the first region of each of the first active pattern and the second active pattern and the first part of the device isolation pattern. The second region of each of the first active pattern and the second active pattern is adjacent to the first region of each of the first active pattern and the second active pattern. A U-shaped structure includes a left gate spacer and a right gate spacer disposed on a sidewall of the first gate structure and a sidewall of the second gate structure, respectively. The U-shaped structure further includes a first protective insulation pattern being in contact with a second part of the device isolation pattern between the first active pattern and the second active pattern and between the first gate structure and the second gate structure.

According to an exemplary embodiment of the present inventive concept, the semiconductor device further includes a third active pattern adjacent to the second active pattern in the first direction, and a second protective insulation pattern being in contact with a third part of the device isolation pattern between the second active pattern and the third active pattern.

According to an exemplary embodiment of the present inventive concept, the first active pattern and the second active pattern are spaced apart from each other at a first distance, and the second active pattern and the third active pattern are spaced apart from each other at a second distance different from the first distance.

According to an exemplary embodiment of the present inventive concept, the first active pattern, the second active pattern and the third active pattern are of the same conductivity type.

According to an exemplary embodiment of the present inventive concept, a sidewall of the first active pattern is in contact with a sidewall of the second active pattern to form a merged source/drain part of the first active pattern and the second active pattern. The air gap is defined by the merged source/drain part of the first active pattern and the second active pattern, the left gate spacer, the right gate spacer and the first protective insulation pattern.

According to an exemplary embodiment of the present inventive concept, each of the left gate spacer and the right gate spacer includes a first spacer and a second spacer. The first protective insulation pattern includes a first sub-protective insulation pattern and a second sub-protective insulation pattern that are sequentially stacked on the device isolation pattern. The first sub-protective insulation pattern is connected to a lower end of the first spacer of the left gate spacer and a lower end of the first spacer of the right gate spacer. The second sub-protective insulation pattern is separated from the second spacer of each of the left gate spacer and the right gate spacer.

BRIEF DESCRIPTION OF DRAWINGS

These and other features of the present inventive concept will become more apparent by describing in detail exemplary embodiments thereof with reference to the accompanying drawings of which:

FIGS. 6A to 13A are cross-sectional views taken along lines I-I' and II-II' of FIG. 1 according to exemplary embodiment of the present inventive concept;

FIGS. 6B to 13B are cross-sectional views taken along lines III-III' and IV-IV' of FIG. 1 according to an exemplary embodiment of the present inventive concept.

Figure 1:
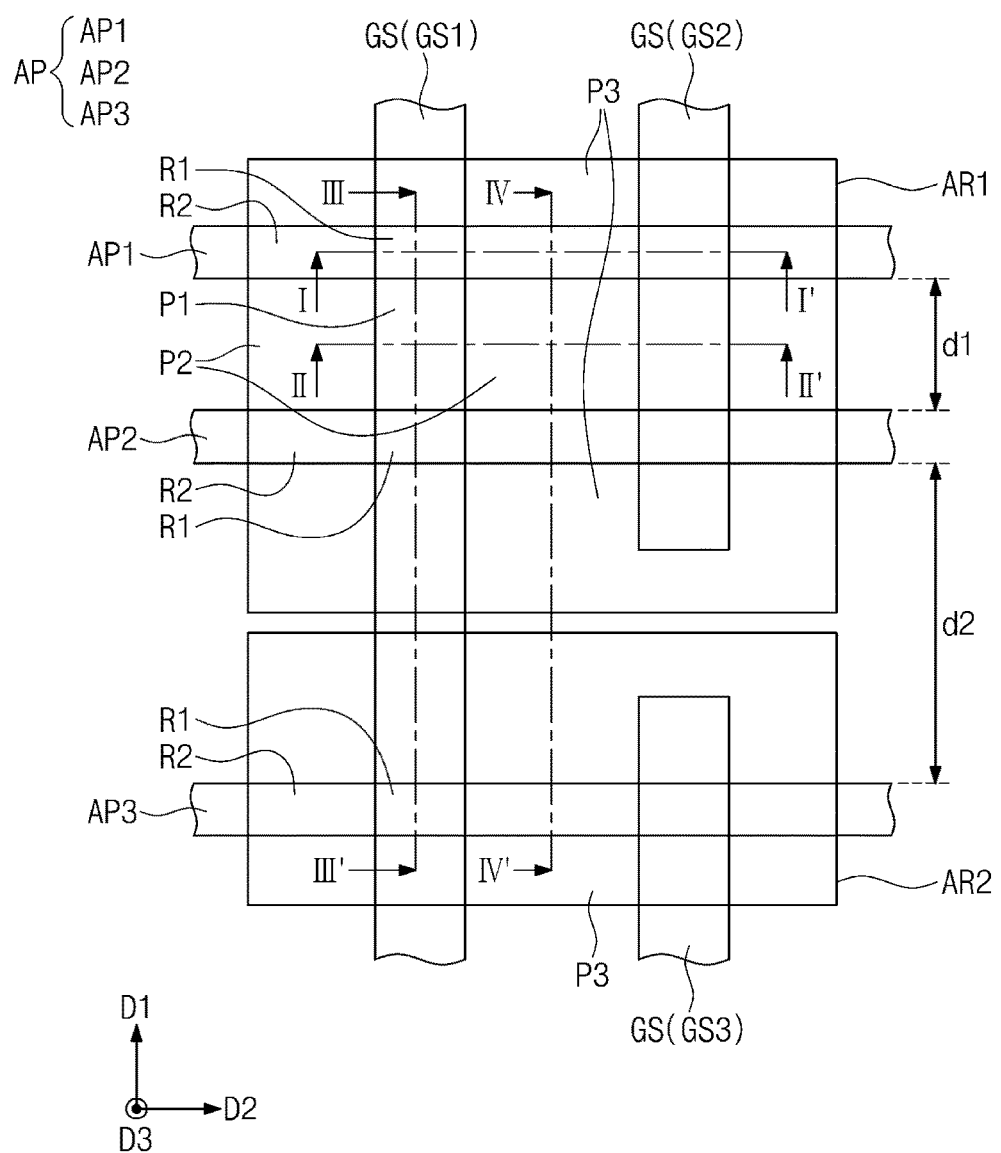
FIG. 1 is a plan view for showing a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

The values such as a material composition, height, thickness and width of a constituent element may be expressed using "substantially the same" or "about", because the values measured in a semiconductor device fabricated according to the present inventive concept may be different from the exact value claimed below due to a process variation for forming the semiconductor device or due to a measurement error.

Figure 2A:
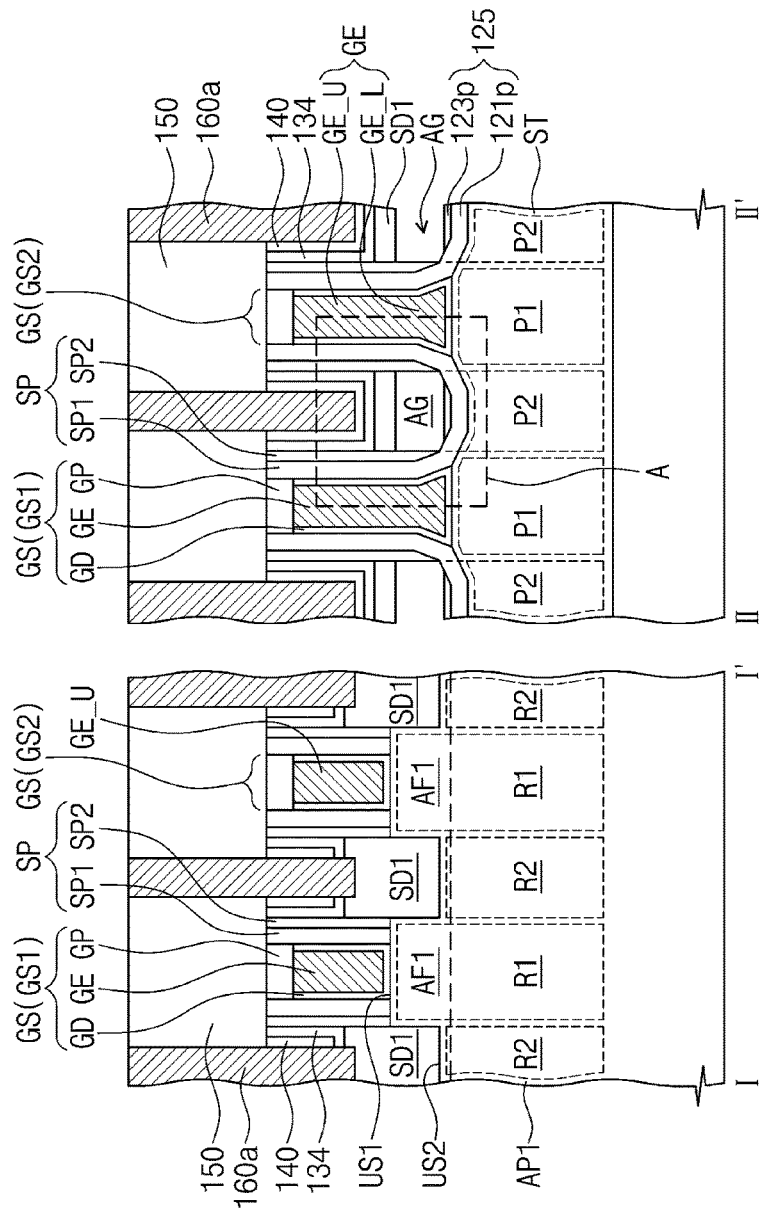
FIG. 2A shows cross-sectional views taken along lines I-I' and II-II' of FIG. 1, according to an exemplary embodiment of the present inventive concept.
Figure 2B:
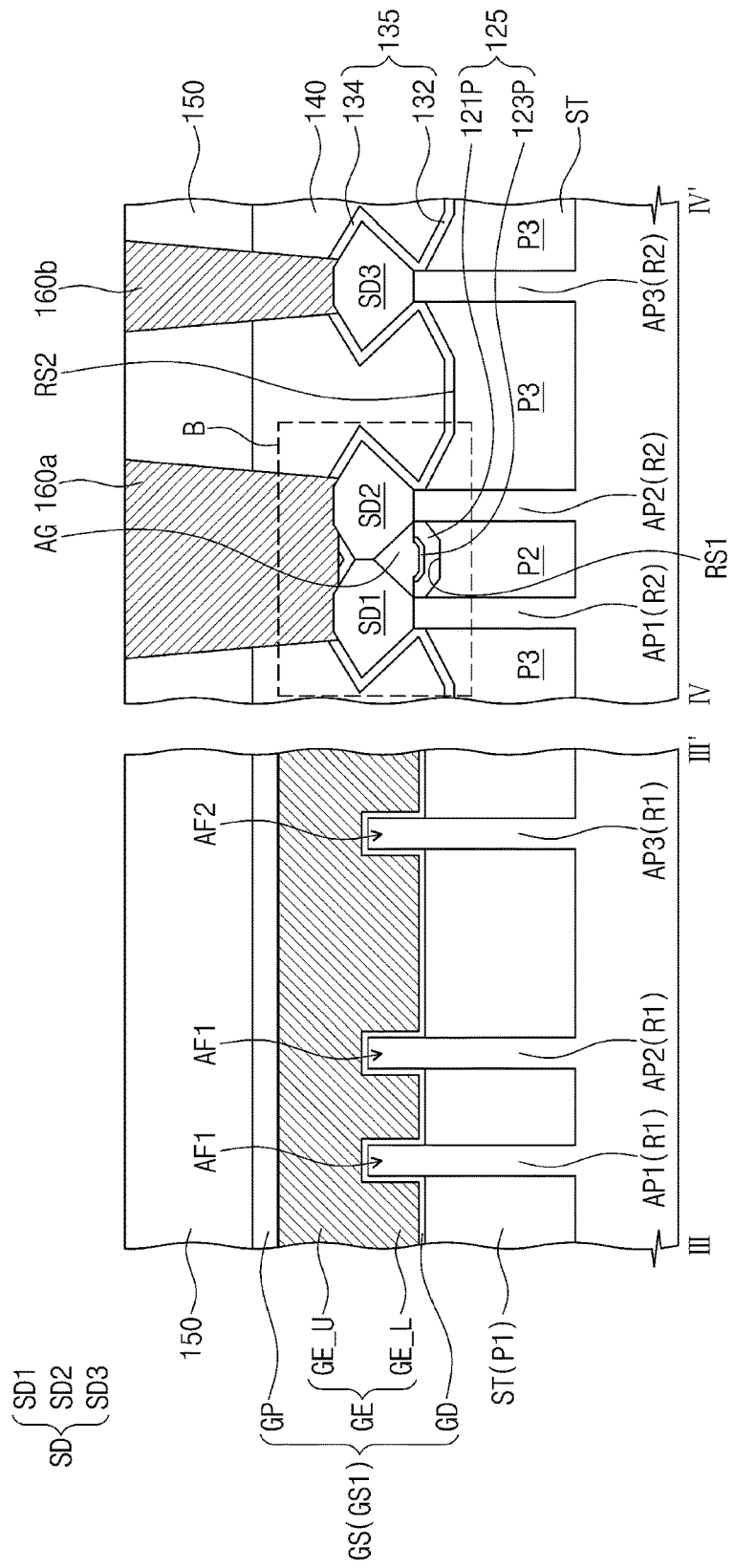
FIG. 2B shows cross-sectional views taken along lines III-III' and IV-IV' of FIG. 1, according to an exemplary embodiment of the present inventive concept.
Figure 3:
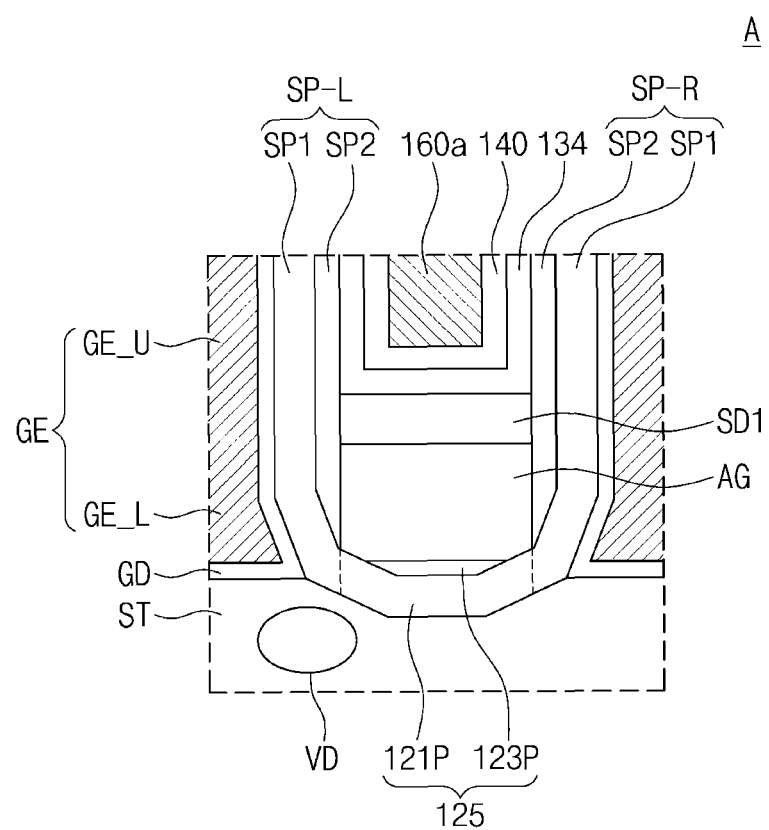
FIG. 3 is an enlarged view corresponding to section A of FIG. 2A, according to an exemplary embodiment of the present inventive concept.
Figure 4A:
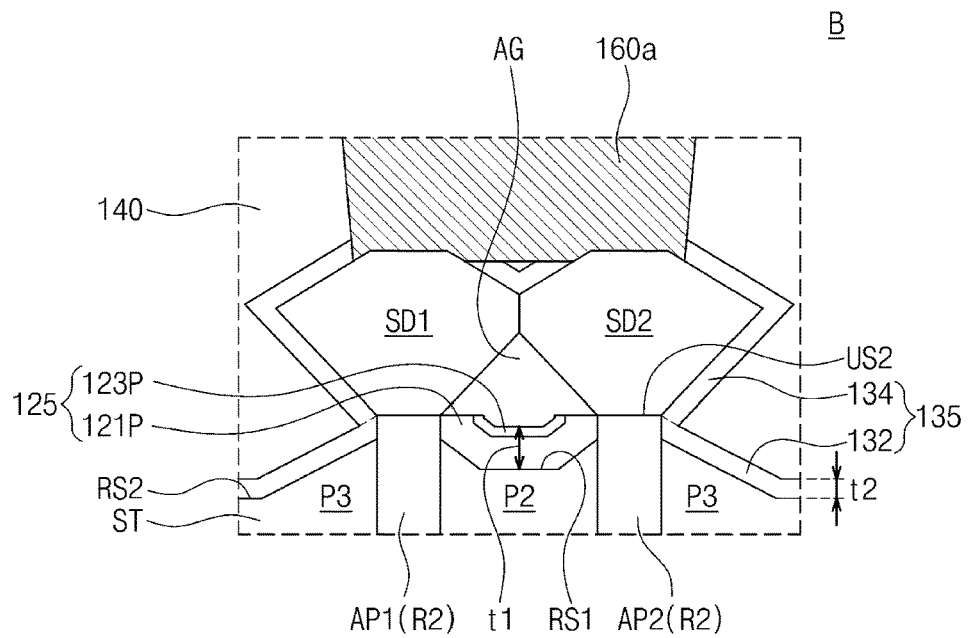
FIGS. 4A, 4B, 4C, and 4D are enlarged views corresponding to section B of FIG. 2B, according to an exemplary embodiment of the present inventive concept.
Figure 4B:
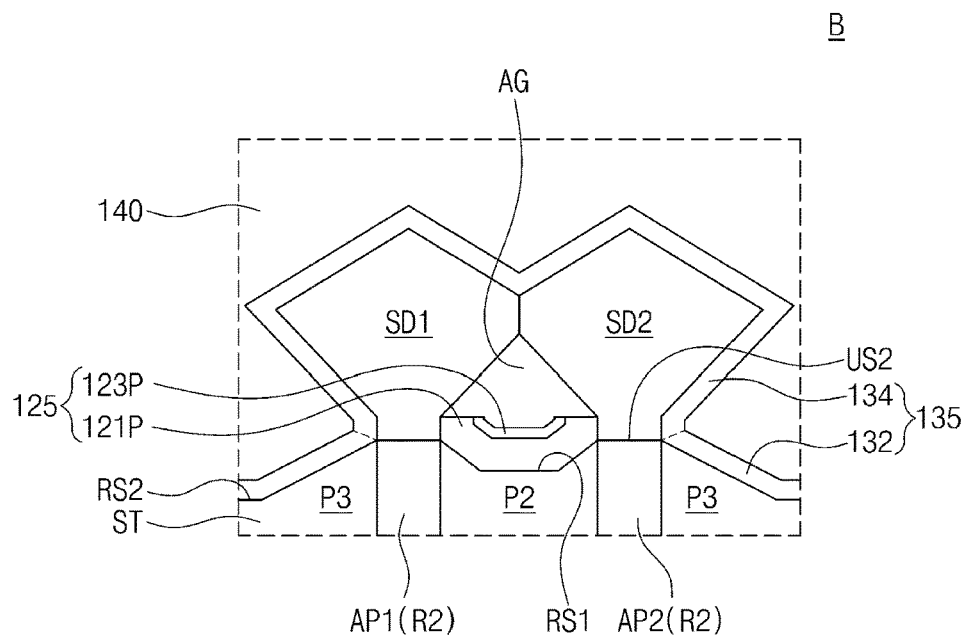
Figure 4C:
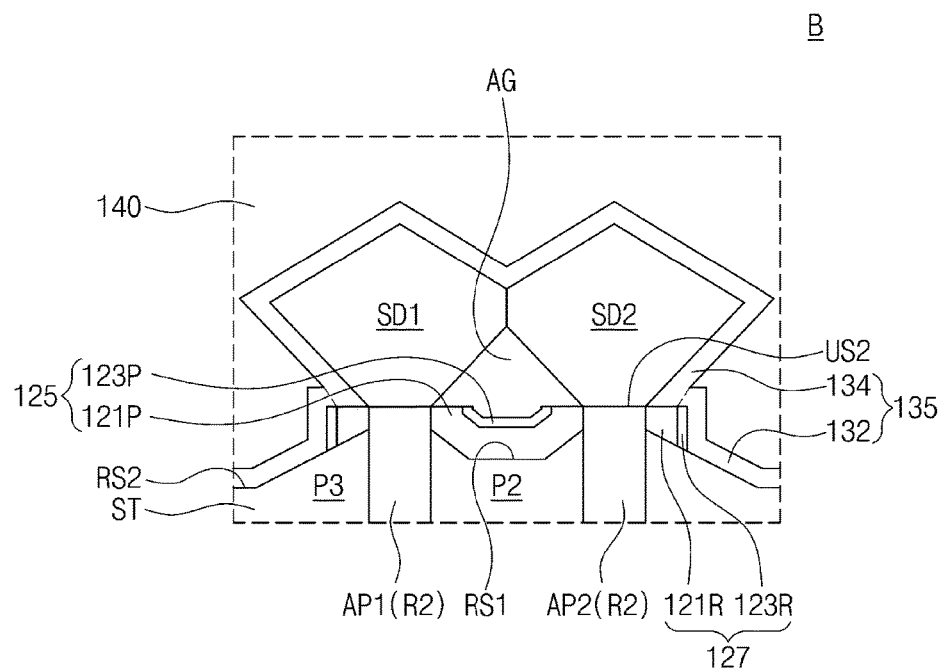

FIG. 1 is a plan view for showing a semiconductor device according to an exemplary embodiment of the present inventive concept. FIG. 2A shows cross-sectional views taken along lines I-I' and II-II' of FIG. 1. FIG. 2B shows cross-sectional views taken along lines III-III' and IV-IV' of FIG. 1. FIG. 3 is an enlarged view corresponding to section A of FIG. 2A. FIGS. 4A, 4B, 4C, and 4D are enlarged views corresponding to section B of FIG. 2B. In FIGS. 4B and 4C, an illustration of some components (e.g., source/drain contact) will be omitted. FIG. 5 is a cross-sectional view taken along line IV-IV' of FIG. 1.

Referring to FIGS. 1, 2A, 2B, 3, and 4A, a substrate 100 may be provided to include a first active region AR1 and a second active region AR2. The substrate 100 may be a semiconductor substrate. For example, the substrate 100 may be a silicon substrate, a germanium substrate, or an SOI (Silicon-On-Insulator) substrate. The first and second active regions AR1 and AR2 may be arranged along, for example, a first direction D1. The first active region AR1 may be provided thereon with first type transistors, and the second active region AR2 may be provided thereon with second type transistors different from the first type transistors. For example, the first type transistors may be an n-type transistor, and the second type transistors may be a p-type transistor, but the present inventive concept is not limited thereto. For convenience of the description, the following description will be made on an exemplary embodiment in which n-type transistors are disposed on the first active region AR1 and p-type transistors are disposed on the second active region AR2. The present inventive concept, however, is not limited thereto. For example, p-type transistors may be disposed on the first active region AR1 and n-type transistors may be disposed on the second active region AR2. The present inventive concept is also applicable where the same type transistors of having different distance d1 and d2 may be disposed on the first active region AR1 or the second active region AR2. The definitions of the distances d1 and d2 will be described below.

A plurality of active patterns AP including a first active pattern AP1, a second active pattern AP2 and a third active pattern AP3 may be provided on the active regions AR1 and AR2. The first active pattern AP1 and the second active pattern AP2 may be disposed on the first active region AR1. A third active pattern AP3 may be disposed on the second active region AR2. The active patterns AP may be disposed along the first direction D1 and may extend along a second direction D2 crossing the first direction D1. The active patterns AP may protrude from the substrate 100 in a direction perpendicular to a top surface of the substrate 100, i.e., a third direction D3 perpendicular to all of the first and second directions D1 and D2. In an exemplary embodiment, the active patterns AP may be a portion of the substrate 100. The present inventive concept is not limited thereto. For example, each of the active patterns AP may be an epitaxial layer formed on the substrate 100. For example, the first active pattern AP1 and the second active pattern AP2 may have a p-type conductivity, and the third active pattern AP3 may have an n-type conductivity.

Figures illustrate that two active patterns AP1 and AP2 adjacent to each other are disposed on the first active region AR1 and one third active pattern AP3 is disposed on the second active region AR2, but the present inventive concept is not limited thereto. Three or more active patterns including the first active pattern AP1 and the second active pattern AP2 may be provided on the first active region AR1, and the third active pattern AP3 may be provided in plural.

In an exemplary embodiment, the first active pattern AP1 may be spaced apart from the second active pattern AP2 at a first distance d1, and the second active pattern AP2 may be spaced apart at a second distance d2 from the third active pattern AP3, which is adjacent to the second active pattern. The second distance d2 may be greater the first distance d1. The second distance d2 may be a spacing interval needed to separate the third active pattern AP3 from the second active pattern AP2 whose a conductivity type is different from a conductivity type of the third active pattern AP3. If the third active pattern AP3 is provided in plural, neighboring third active patterns AP3 may be spaced apart from each other at an interval equal to or greater than the first distance d1.

In an exemplary embodiment, the first active region AR1 may be provided with a plurality of active patterns arranged with at least two distances d1 and d2. In this case, the second distance d2 may be a spacing interval between the third active pattern AP3 and the second active pattern AP2 whose a conductivity type is the same as a conductivity type of the third active pattern AP3. The present inventive concept is not limited thereto. For example, the second active region AR2 may be provided with a plurality of active patterns arranged with at least two distances d1 and d2.

Each of the active patterns AP may include a first region R1 below a gate structure GS which will be discussed below and second regions R2 on opposite sides of the gate structure GS. For example, the first region R1 may be overlapped with the gate structure GS; and the second regions R2 of each of the active patterns AP may be non-overlapped with the gate structure GS. The second region R2 may have a top surface US2 whose a height is less than a height of a top surface US1 of the first region R1. In this description, a height of a top surface of one component may be defined by a shortest distance from the substrate 100 to the top surface of one component along the third direction D3.

The substrate 100 may be provided thereon with a device isolation pattern ST exposing upper portions of the active patterns AP. For example, the first regions R1 may have their upper portions that protrude from a top surface of the device isolation pattern ST and are exposed through the device isolation pattern ST. The exposed upper portions of the first regions R1 may be defined as active fins AF1 and AF2. In an exemplary embodiment, the second regions R2 may also have their upper portions that protrude from the top surface of the device isolation pattern ST and are exposed through the device isolation pattern ST. The upper portion of the second region R2 may have a protruding length less than protruding lengths of the active fins AF1 and AF2. The device isolation pattern ST may include, for example, silicon oxide.

In an exemplary embodiment, the device isolation pattern ST may include first, second, and third parts P1, P2, and P3. The first part P1 may be positioned below the gate structure GS. For example, the first part P1 may be a portion of the device isolation pattern ST that overlaps the gate structure GS. The second parts P2 of the device isolation pattern ST may be positioned on the opposite sides of each of the gate structures GS between the first active pattern AP1 and the second active pattern AP2 adjacent to each other. The third parts P3 may be positioned between the second active pattern AP2 and the third active pattern AP3 adjacent to each other or on sides of outermost active patterns AP1 and AP3 on a pair of the active regions AR1 and AR2. Each of the second and third parts P2 and P3 may have a recessed upper portion. The second and third parts P2 and P3 may therefore have recessed top surfaces RS1 and RS2, respectively. A pattern density may cause the second and third parts P2 and P3 to have recess depths different from each other. For example, the recess depth may be smaller on a narrower region (i.e., a region having a higher pattern density) between the active patterns than on a wider region (i.e., a region having a lower pattern density) between the active patterns. For example, the second part P2 may have the recessed top surface RS1 whose a height is greater than a height of the recessed top surface RS2 of the third part P3. Figures illustrate that bottom surfaces of the first to third parts P1 to P3 are of the same height, but the present inventive concept is not limited thereto. For example, differently from those shown in the figures, the third part P3 may have a bottom surface deeper than a bottom surface of the second part P2.

The substrate 100 may be provided thereon with gate structures GS running across at least one of the active patterns AP. The gate structures GS may extend in the first direction D1 and be spaced apart from each other in the first direction D1 (GS2 and GS3) or in the second direction D2 (GS1 and GS2 or GS1 and GS3). For example, the gate structures GS may include a first gate structure GS1 running across the active patterns AP1, AP2 and AP3, a second gate structure GS2 spaced apart from the first gate structure GS1 in the second direction D2 and running across a pair of the first active pattern AP1 and the second active pattern AP2, and a third gate structure GS3 spaced apart from the second gate structure GS2 in a direction reverse to the first direction D1 and running across the third active pattern AP3. Each of the first to third gate structures GS1 to GS3 may cover top surfaces and sidewalls of its corresponding active fins AF1 and AF2 and also cover top surfaces of the first parts P1 of the device isolation pattern ST. The active fins AF1 and AF2 locally disposed below each of the gate structures GS may serve as channels of transistors.

Each of the gate structures GS may include a gate electrode GE, a gate dielectric pattern GD, and a gate capping pattern GP. The gate electrode GE may extend in the first direction D1 and cover at least one of the active fins AF1 and AF2. The gate electrode GE may include an upper part GE_U positioned higher than the top surfaces of the active fins AF1 and AF2 and a lower part GE_L positioned lower than top surfaces of the active fins AF1 and AF2. Sidewalls of the upper part GE_U of the gate electrode GE may be substantially perpendicular to the top surface of the substrate 100, and sidewalls of the lower part GE_L of the gate structure GE may include a downwardly inclined portion. For example, the upper part GE_U of the gate electrode GE may have a substantially uniform width, and the lower part GE_L of the gate electrode GE may have a portion of which a width increases downwardly toward the substrate 100. The gate electrode GE may include one or more of conductive metal nitride (e.g., titanium nitride, tantalum nitride, etc.) and metal (e.g., aluminum, tungsten, etc.).

The gate dielectric pattern GD may be disposed between the gate electrode GE and the active fins AF1 and AF2 and may horizontally extend to cover the top surfaces of the first parts P1 of the device isolation pattern ST. For example, the gate dielectric pattern GD may extend in the first direction D1 along a bottom surface of the gate electrode GE. In addition, the gate dielectric pattern GD may also be disposed between the gate electrode GE and a gate spacer SP which will be discussed below. The gate dielectric pattern GD may include at least one of high-k dielectric layers. For example, the gate dielectric pattern GD may include one or more of hafnium oxide, hafnium silicate, zirconium oxide, and zirconium silicate, but the present inventive concept is not limited to these materials. The gate capping pattern GP may be disposed on a top surface of the gate electrode GE and may extend in the first direction D1 along the top surface of the gate electrode GE. The gate capping pattern GP may include, for example, silicon nitride or silicon oxynitride.

A gate spacer SP may be disposed on sidewalls of the gate electrode GE. The gate spacer SP may extend in the first direction D1 along the sidewall of the gate electrode GE. In an exemplary embodiment, the gate spacer SP may have a single- or multi-layered structure. For example, the gate spacer SP may include a first gate spacer SP1 and a second spacer SP2 that are sequentially disposed on the sidewall of the gate electrode GE. Each of the first and second gate spacers SP1 and SP2 may include a silicon nitride layer, a silicon oxynitride layer, or a silicon oxycarbonitride layer. In an exemplary embodiment, the first and second gate spacers SP1 and SP2 may include the same material. In this case, the gate spacer SP may have a single-layered structure. In an exemplary embodiment, the first and second gate spacers SP1 and SP2 may include different materials from each other. For example, the first gate spacer SP1 may include a silicon oxycarbonitride layer, and the second spacer SP2 may include a silicon nitride layer, or vice versa. In this case, the gate spacer SP may have a double-layered structure. In an exemplary embodiment, the gate spacer SP may have a triple-layered structure of different materials. The first gate spacer SP1 may have a thickness substantially the same as or greater than a thickness of the second gate spacer SP2. The present inventive concept, however, is not limited thereto.

Protective insulation patterns 125 and 132 may be disposed on the top surface of the device isolation pattern ST exposed through the gate structures GS adjacent to each other. The protective insulation patterns 125 and 132 may include first protective insulation patterns 125 on top surfaces of the second parts P2 of the device isolation pattern ST and second protective insulation patterns 132 on top surfaces of the third parts P3 of the device isolation pattern ST.

Each of the first protective insulation patterns 125 may be in contact with the top surface of its underlying device isolation pattern ST and connected to a lower end of its adjacent gate spacer SP.

For example, the third parts P3 each may be a region of the device isolation pattern ST exposed by two active patterns adjacent to each other at the second distance d2. In FIG. 2B, the second protective insulation patterns 132 each may be disposed on one of the third parts P3 of the device isolation pattern ST. In an exemplary embodiment, the second protective insulation patterns 132 each may be in contact with one of the third parts P3 of the device isolation pattern ST.

For example, the second parts P2 each may be a region of the device isolation pattern ST exposed by two active patterns adjacent to each other at the first distance d1. In FIG. 2A, the first protective insulating patterns 125 each may be disposed on one of the second parts P2 of the device isolation pattern ST. In an exemplary embodiment, the first protective insulating patterns 125 each may be in contact with one of the second parts P2 of the device isolation pattern ST.

For example, the first protective insulation pattern 125 between the first and second gate structures GS1 and GS2 may be connected in common to the gate spacers SP on facing sidewalls of the first and second gate structures GS1 and GS2. As viewed in cross-section taken along the second direction D2, a "U" shape may be given to the first protective insulation pattern 125 and the gate spacers SP connected to opposite sides of the first protective insulation pattern 125. For example, a connected structure of the first protective insulation pattern 125 and the gate spacers SP may constitute a U-shaped structure. In the U-shaped structure, a lower portion of a gate spacer SP (left gate spacer) on a sidewall of the first gate structure GS1 may be connected to one end of the first protective insulation pattern 125, and a lower portion of a gate spacer SP (right gate spacer) on a sidewall of the second gate structure GS2 may be connected to an opposite end of the first protective insulation pattern 125.

In addition, the first protective insulation pattern 125 between the first and second gate structures GS1 and GS2 may cover the top surface of its underlying second part P2. For example, the first protective insulation pattern 125 between the first and second gate structures GS1 and GS2 may be in contact with the top surface of its underlying second part P2. In an exemplary embodiment, the first protective insulation pattern 125 between the first and second gate structures GS1 and GS2 may cover all the top surface of its underlying second part P2 exposed between two adjacent gate structures GS1 and GS2.

Each of the first protective insulation patterns 125 may have a single- or multi-layered structure. For example, each of the first protective insulation patterns 125 may include a first sub-protective insulation pattern 121P in contact with the top surface of its underlying device isolation pattern ST (i.e., the recessed top surface RS1 of the second part P2) and a second sub-protective insulation pattern 123P on the first sub-protective insulation pattern 121P. In an exemplary embodiment, the first protective insulation pattern 125 may be composed of only the first sub-protective insulation pattern 121P. The first sub-protective insulation pattern 121P may include the same material as a material of the first gate spacers SP1. The second sub-protective insulation patterns 123P may include the same material as a material of the second gate spacers SP2. For example, each of the first and second sub-protective insulation patterns 121P and 123P may include a silicon nitride layer, a silicon oxynitride layer, or a silicon oxycarbonitride layer. The first protective insulation pattern 125 may have a first thickness t1, which is defined by its vertical thickness on the recessed top surface RS1 of the second part P2. In an exemplary embodiment, as shown in FIG. 4A, the second region R2 may have an upper sidewall protruding from the top surface of the device isolation pattern ST, and the first protective insulation pattern 125 may be in contact with the upper sidewall of the second region R2. The present inventive concept, however, is not limited thereto.

Each of the second protective insulation patterns 132 may be connected to its adjacent contact etch stop pattern 134 and in contact with the top surface of its underlying device isolation pattern ST (i.e., the recessed top surface RS2 of the third part P3). The second protective insulation patterns 132 may be composed of a single layer, but the present inventive concept is not limited thereto. The second protective insulation patterns 132 may have a second thickness t2, which is defined by its vertical thickness on the recessed top surface RS2 of the third part P3. The second thickness t2 may be less than the first thickness t1. For example, the second protective insulation patterns 132 may include a silicon nitride layer, a silicon oxynitride layer or a silicon oxycarbonitride layer.

Source/drain regions SD may be disposed on the active patterns AP (i.e., the second regions R2) on opposite sides of each of the gate structures GS. The source/drain regions SD may include a first source/drain region SD1 on the first active pattern AP1, a second source/drain region SD2 on the second active pattern AP2 and a third source/drain region SD3 on the third active pattern AP3. For example, the first source/drain region SD1 and the second source/drain region SD2 may have an n-type conductivity, and the third source/drain region SD3 may have a p-type conductivity. The present inventive concept, however, is not limited thereto. For example, the first source/drain region SD1 and the third source/drain region SD3 may have the same conductivity type, if the active patterns AP may be disposed on the same active region of the first active region R1 or the second active region R2.

In an exemplary embodiment, each of the source/drain regions SD may be an epitaxial pattern grown from its underlying active pattern used as a seed layer. In this case, the first and second source/drain regions SD1 and SD2 may include a material that provides the first active fins AF1 with a tensile strain, and the third source/drain region SD3 may include a material that provides the second active fins AF2 with a compressive strain. For example, when the substrate 100 is a silicon substrate, the first and second source/drain regions SD1 and SD2 may include a silicon carbide (SiC) layer whose a lattice constant is less than a lattice constant of Si or a silicon (Si) layer whose a lattice constant is substantially the same as a lattice constant of the substrate 100. The third source/drain region SD3 may include a SiGe layer whose a lattice constant is greater than a lattice constant of Si. From the viewpoint of horizontal position, each of the first active fins AF1 may be positioned between a pair of neighboring first source/drain regions SD1 or a pair of neighboring second source/drain regions SD2, and each of the second active fins AF2 may be positioned between a pair of neighboring third source/drain regions SD3.

As viewed in cross-section taken along the first direction D1, the source/drain regions SD may have sidewalls each having a laterally sharp wedge shape where a lower sidewall and an upper sidewall meet each other. For example, each of the source/drain regions SD may have sidewalls each of which includes a lower sidewall substantially negatively inclined to the top surface of the substrate 100 and an upper sidewall substantially positively inclined to the top surface of the substrate 100. In an exemplary embodiment, the first and second source/drain regions SD1 and SD2 adjacent to each other may have lower sidewalls (or facets) connected to each other. An air gap AG may be formed below the sidewalls connected to each other. The air gap AG may be a substantially hollow space where no solid material is provided. For example, two adjacent first and second source/drain regions SD1 and SD2 may be in contact with each other to the extent that the air gap AG has a top surface defined by the lower sidewalls of the two adjacent first and second source/drain regions SD1 and SD2. The air gap AG may have a bottom surface defined by the top surface of the first protective insulation pattern 125. In an exemplary embodiment, the air gap AG may have a bottom surface defined by a top surface of the first protective insulation pattern 125.

The contact etch stop patterns 134 may be disposed on the source/drain regions SD. The contact etch stop patterns 134 may conformally cover the sidewalls of the source/drain regions SD and extend onto sidewalls of the gate structures GS. The contact etch stop patterns 134 and the second protective insulation patterns 132 may include the same material. The contact etch stop patterns 134 may be connected to the second protective insulation patterns 132. For example, the contact etch stop patterns 134 may include a silicon oxide layer, a silicon oxynitride layer or silicon oxycarbonitride layer. In addition, the contact etch stop patterns 134 may have substantially the same thickness as the second thickness t2 of the second protective insulation patterns 132. The second protective insulation patterns 132 and the contact etch stop patterns 134 may form a capping insulation patterns 135. For example, one of the second protective insulation patterns 132 and at least one of the contact etch stop patterns 134 may be connected to each other to constitute a single insulation layer. As such, each of the second protective insulation patterns 132 and each of the contact etch stop patterns 134 may correspond to a portion of the single insulation layer. In contrast, the contact etch stop patterns 134 need not cover the lower sidewalls, facing each other, of the two adjacent first source/drain regions SD1 which define the air gap AG. For example, the contact etch stop patterns 134 need not be present in the air gap AG on the second part P2 of the device isolation pattern ST.

The first protective insulation patterns 125 or the source/drain regions SD may be provided in various shapes. In an exemplary embodiment, as shown in FIG. 4B, the first protective insulation pattern 125 may have an upper portion that protrudes from the top surface US2 of the second region R2 and is in contact with the sidewalls of the first and second source/drain regions SD1 and SD2 adjacent to each other.

In an exemplary embodiment, as shown in FIG. 4C, residual protective insulation patterns 127 may be disposed on top surfaces RS2 of the third parts P3 of the device isolation pattern ST that are adjacent to the first and second active patterns AP1 and AP2. For example, the first protective insulation pattern 125 may be disposed between the first active pattern AP1 and the second active pattern AP2, and the residual protective insulation patterns 127 may be disposed on opposite sides of a pair of the first active pattern AP1 and the second active pattern AP2. For example, the residual protective insulation pattern 127 and the first protective insulation pattern 125 adjacent to each other may be spaced apart from each other in the first direction D1 across the pair of the first active pattern AP1 and the second active pattern AP2. For example, each of the residual protective insulation patterns 127 may include a first residual spacer 121R and a second residual spacer 123R on the first residual spacer 121R. The first residual spacer 121R may be in contact with an upper sidewall of the second region R2 exposed by the device isolation pattern ST. The first residual spacer 121R may include the same material as a material of each of the first gate spacers SP1. The second residual spacer 123R may include the same material as a material of each of the second gate spacers SP2.

Figure 4D:
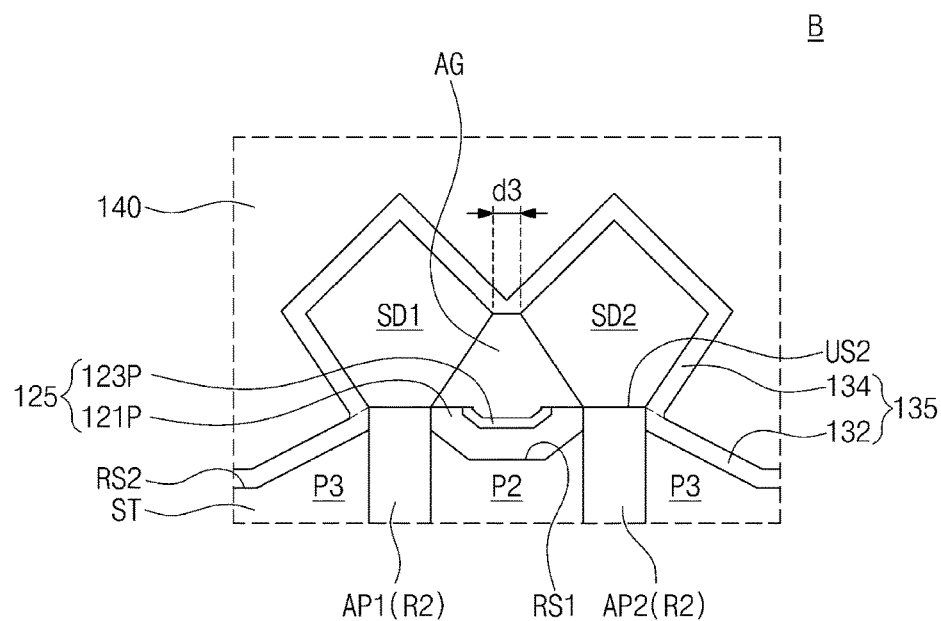
Figure 5:
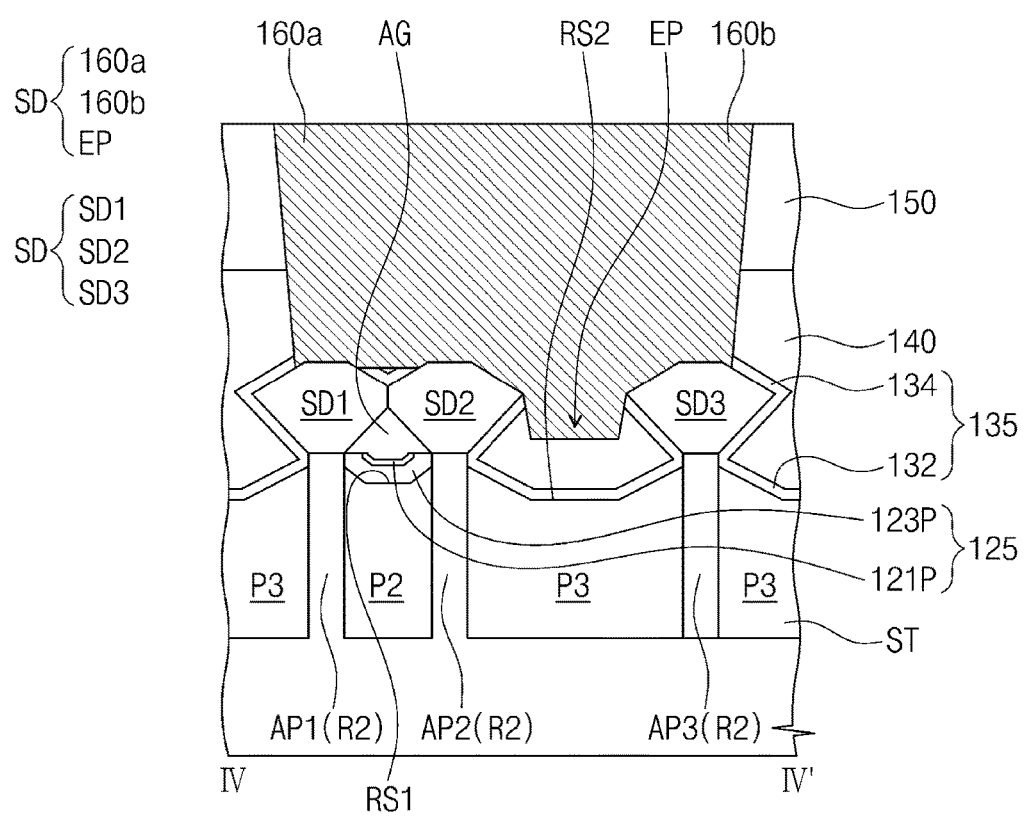
FIG. 5 is a cross-sectional view taken along line IV-IV' of FIG. 1, according to an exemplary embodiment of the present inventive concept.

In an exemplary embodiment, as shown in FIG. 4D, the first and second source/drain regions SD1 and SD2 adjacent to each other may have sidewalls facing each other and spaced apart from each other. For example, the facing sidewalls of the two adjacent first and second source/drain regions SD1 and SD2 may be spaced apart at a third distance d3 less than about twice the second thickness t2 of the second protective insulation patterns 132. The contact etch stop pattern 134 may fill a space of the third distance d3 between the facing sidewalls of the two adjacent first and second source/drain regions SD1 and SD2. For example, each of the contact etch stop patterns 134 may close the top surface of an air gap AG. In this case, the air gap AG may be formed below the two adjacent first and second source/drain regions SD1 and SD2, and the contact etch stop pattern 134 between the two adjacent first and second source/drain regions SD1 and SD2. As not shown in figures, configuration features of the embodiments depicted in FIGS. 4B and 4C may also be applicable to the embodiment of FIG. 4D.

Referring to FIGS. 1, 2A, 2B, 3, and 4A, the substrate 100 may be provided thereon with a first interlayer dielectric layer 140 covering the source/drain regions SD and the sidewalls of the gate structures GS. The first interlayer dielectric layer 140 may have a top surface coplanar with top surfaces of the gate structures GS and top surfaces of the gate spacers SP at substantially the same height. The first interlayer dielectric layer 140 may include, for example, one or more of a silicon oxide layer and a low-k dielectric layer. A second interlayer dielectric layer 150 may be disposed on the first interlayer dielectric layer 140. The second interlayer dielectric layer 150 may cover the top surfaces of the gate structures GS. The second interlayer dielectric layer 150 may include one or more of a silicon oxide layer, a silicon nitride layer, a silicon oxynitride layer, and a low-k dielectric layer.

Source/drain contacts 160a and 160b may be disposed on opposite sides of each of the gate structures GS. The source/drain contacts 160a and 160b may penetrate the second interlayer dielectric layer 150, the first interlayer dielectric layer 140, and the contact etch stop patterns 134 such that the source/drain regions SD may be connected to the source/drain contacts 160a and 160b. The source/drain contacts 160a and 160b may include a first source/drain contact 160a connected to the first and second source/drain regions SD1 and SD2 and a second source/drain contact 160b connected to the third source/drain region SD3. In an exemplary embodiment, the first source/drain contact 160a may be commonly connected to a pair of the first and second source/drain regions SD1 and SD2 disposed on a side of the gate structure GS.

In an exemplary embodiment, the first source/drain contact 160a may be connected to the second source/drain contact 160b to form a source/drain contact 160. For example, as shown in FIG. 5, the source/drain contact 160 may be commonly connected to a pair of the first and second source/drain regions SD1 and SD2 disposed on a side of the gate structure GS and the third source/drain region SD3 adjacent to the pair of the first and second source/drain regions SD1 and SD2. In this case, the source/drain contact 160 may include an extension part EP extending between the second source/drain region SD2 and the third source/drain region SD3 adjacent to each other. The extension part EP may have a bottom surface positioned lower than a contact surface between the source/drain contact 160 and the source/drain regions SD.

The second interlayer dielectric layer 150 may be provided thereon with routing lines (not shown) coupled to the source/drain contacts 160a and 160b. The routing lines (not shown) may be configured to provide the source/drain regions SD with voltage through the source/drain contacts 160a and 160b. The source/drain contacts 160a and 160b and the routing lines (not shown) may include a conductive material (e.g., metal and/or metal nitride).

As a pitch between active patterns becomes reduced, a process of forming a device isolation pattern to fill a space between the active patterns adjacent to each other may have an insufficient process margin to the extent that a void VD, as shown in FIG. 3, may be formed in an upper portion of the device isolation pattern ST. The void VD may be adjacent to a lower portion of the gate electrode GE. The void VD may provide a permeation path to an etchant used in a process where a gate electrode is formed in a gate last process. If an etchant permeated through the void VD may flow into the air gap AG below a source/drain region, etching damage may occur to the source/drain region (see FIG. 15). In addition, this permeation path may be used as an outflow route of a conductive material constituting the gate electrode. For example, if the conductive material is present in the permeation path, the gate electrode is electrically short with the source/drain region. However, according to an exemplary embodiment of the present inventive concept, the protective insulation patterns 125 and 132, before the gate electrode is formed in the gate last process, are provided on the device isolation pattern ST between active patterns (e.g., the first protective insulation pattern 125 is provided on a narrower region (having the first distance d1) between two active patterns AP1 and AP2, and the second protective insulation pattern 132 is provided on a wider region (having the second distance d2) between a second active pattern AP2 and a third active pattern AP3 adjacent to the second active pattern AP2). An etchant for removing a sacrificial gate pattern which is replaced with a gate electrode in the gate last process may be prevented from permeating into the void VD. (See FIGS. 7A to 13A). If the etchant permeates into the void VD, the etchant may flow into the air gap AG to etch the source/drain region (see FIG. 14). An electrical short between the gate electrode and the source/drain region may be prevented by blocking an outflow of a gate electrode material through the etchant permeation path. As a result, a semiconductor device may have increased electrical characteristics and reliability.

Figure 14:
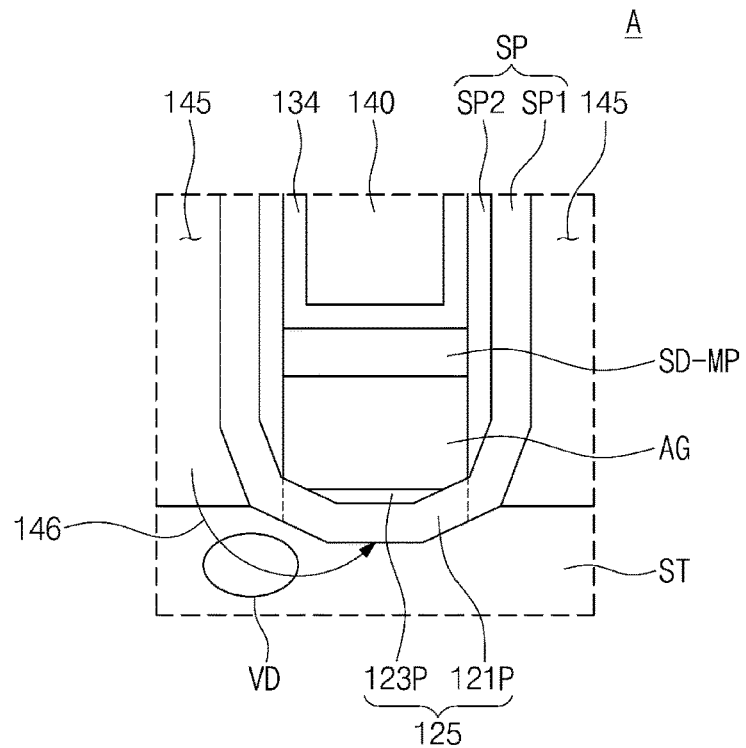
FIGS. 14 and 15 are enlarged views corresponding to section A shown in FIG. 12A according to an exemplary embodiment of the present inventive concept.
Figure 15:
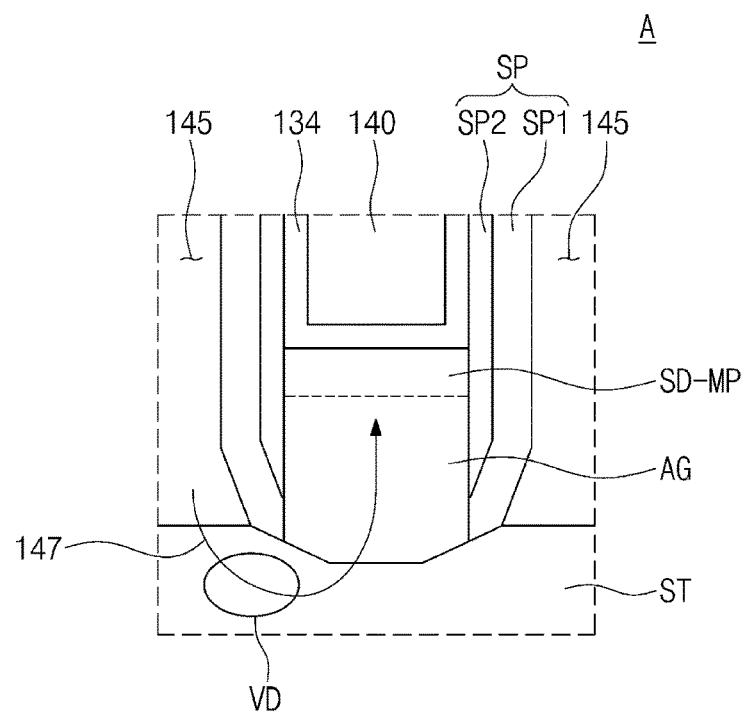

A method of fabricating a semiconductor device according to an exemplary embodiment of the present inventive concept will be described hereinafter. FIGS. 6A to 13A are cross-sectional views taken along lines I-I' and II-IP of FIG. 1 according to an exemplary embodiment of the present inventive concept. FIGS. 6B to 13B are cross-sectional views taken along lines III-III' and IV-IV' of FIG. 1. FIGS. 14 and 15 are enlarged views corresponding to section A shown in FIG. 12A. For brevity of the description, a repetitive explanation will be omitted.

Figure 6A:
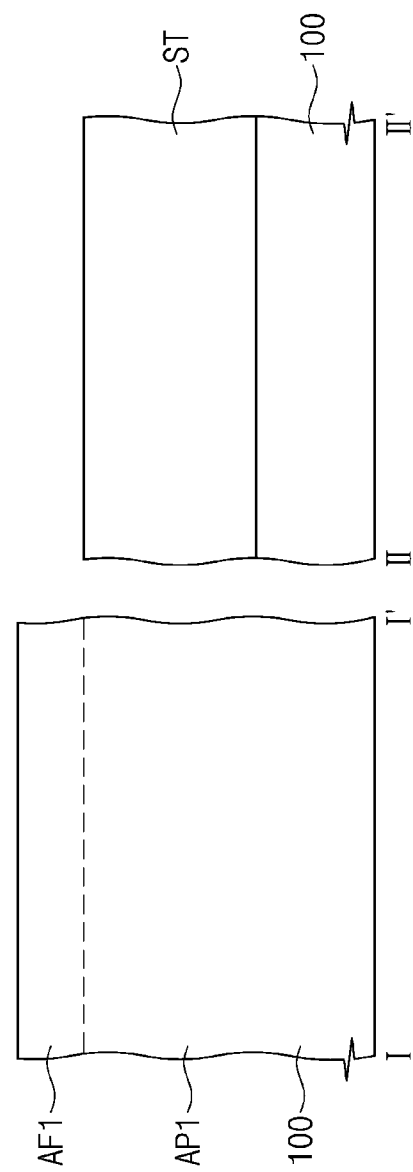

Referring to FIGS. 6A, and 6B, a substrate 100 may be provided to include a first active region AR1 and a second active region AR2. The substrate 100 may be a semiconductor substrate. For example, the substrate 100 may be a silicon substrate, a germanium substrate, or an SOI (Silicon-On-Insulator) substrate. For example, an n-type transistor may be formed on the first active region AR1, and a p-type transistor may be formed on the second active region AR2. The first and second active regions AR1 and AR2 may be arranged along, for example, a first direction D1.

In an exemplary embodiment, the substrate 100 may be patterned to form trenches 101 defining active patterns AP including a first active pattern AP1, a second active pattern AP2 and a third active pattern AP3. The active patterns AP may be formed disposed along the first direction D1 and extending in a second direction D2 crossing the first direction D1. The active patterns AP may protrude from the substrate 100 in a third direction D3 perpendicular to a top surface of the substrate 100. The first active pattern AP1 and the second active pattern AP2 may be doped with an impurity to have a p-type conductivity, and the third active pattern AP3 may be doped with an impurity to have an n-type conductivity. The first active pattern AP1 and the second active pattern AP2 may be spaced apart from each other at a first distance d1, and the second active pattern AP2 may be spaced apart from the third active pattern AP3 adjacent to the second active pattern AP2 at a second distance d2. The second distance d2 may be greater the first distance d1. (See also, FIG. 1). In an exemplary embodiment, the first distance d1, measured in parallel to the first direction D1, may be a shortest distance between facing sidewalls of two active patterns AP1 and AP2 adjacent to each other. In an exemplary embodiment, the second distance d2, measured in parallel to the first direction D1, may be a shortest distance between a sidewall of the second active pattern AP2 and a sidewall of the third active pattern AP3 adjacent to the second active pattern AP2. The sidewall of the second active pattern AP2 and the sidewall of the third active pattern AP3 adjacent to the second active pattern AP2 may face to each other.

A device isolation pattern ST may be formed in the trenches 101. The device isolation pattern ST may be formed to expose upper portions of the first and second active patterns AP1 and AP2. The upper portions of the active patterns AP exposed through the device isolation pattern ST may be defined as first and second active fins AF1 and AF2 disposed in the first and second active regions AR1 and AR2, respectively. The device isolation pattern ST may be formed by forming an insulation layer to fill spaces between the active patterns AP and then recessing an upper portion of the insulation layer. For example, the insulation layer may be formed using a polysilazane-based inorganic SOG layer having superior gap-fill characteristics or using a flowable chemical vapor deposition (FCVD) process. During the formation of the insulation layer, a void VD as shown in FIG. 3 may be formed in an upper portion of the insulation layer.

Figure 7A:
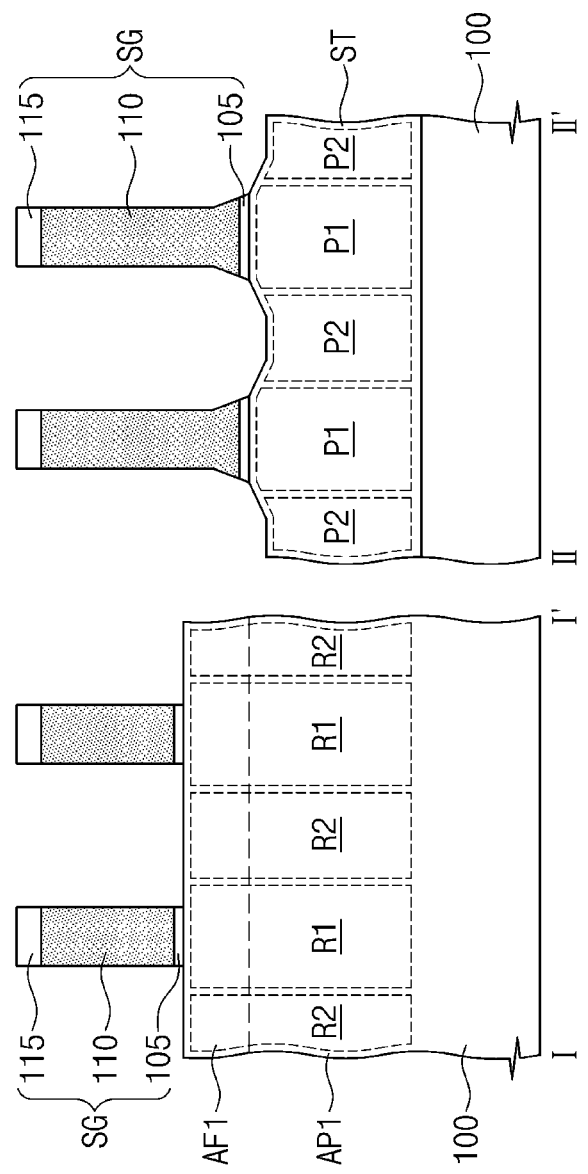
Figure 7B:
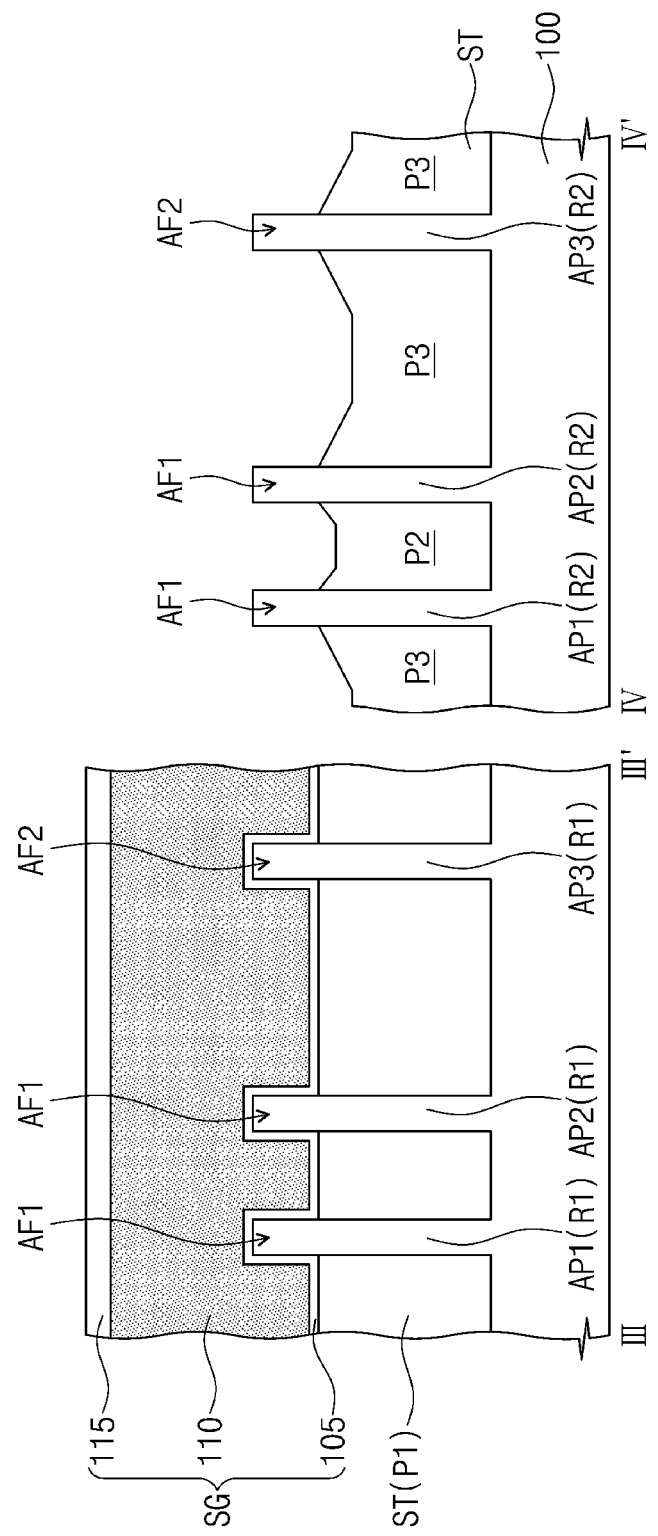

Referring to FIGS. 7A and 7B, sacrificial gate structures SG may be formed on the resulting structure of FIGS. 6A and 6B. The sacrificial gate structures SG each may include an etch stop pattern 105, a sacrificial gate pattern 110, and a gate mask pattern 115 that are sequentially stacked.

For example, an etch stop layer and a sacrificial gate layer may be sequentially formed on the substrate 100, so that the active fins AF1 and AF2 and the device isolation pattern ST may be covered with the etch stop layer and the sacrificial gate layer. For example, the etch stop layer may include silicon oxide. The sacrificial gate layer may include a material having etch selectivity with respect to the etch stop layer. For example, the sacrificial gate layer may include polysilicon. The sacrificial gate layer may be formed by a chemical vapor deposition (CVD) process, a physical vapor deposition (PVD) process, an atomic layer deposition (ALD) process, or so forth. After the sacrificial gate layer is formed, the sacrificial gate layer may be planarized on its top surface. A gate mask pattern 115 may be formed on the planarized sacrificial gate layer, and then an anisotropic etching process may be performed using the gate mask pattern 115 as an etch mask. As a result, sacrificial gate patterns 110 may be formed to run across at least one of the active patterns AP. The gate mask pattern 115 may include, for example, silicon nitride. In an exemplary embodiment, the sacrificial gate pattern 110 may be formed to have an upper portion and a lower portion. The upper portion of the sacrificial gate pattern 110 may be positioned higher than top surfaces of the active fins AF1 and AF2. A sidewall of the sacrificial gate pattern 110 may be substantially vertical to the top surface of the substrate 100. The lower portion of the sacrificial gate pattern 110 may be positioned lower than the top surfaces of the active fins AF1 and AF2. The present inventive concept is not limited thereto. For example, the lower portion may have a downwardly inclined sidewall. This dissimilarity in shape between the upper and lower portions of the sacrificial gate pattern 110 may be caused from difference in etching depth or pattern density or both of an etching target when the sacrificial gate layer is etched.

After the sacrificial gate patterns 110 are formed, the etch stop layer exposed through the sacrificial gate patterns 110 may be removed such that etch stop patterns 105 may remain below the sacrificial gate patterns 110. Each of the etch stop patterns 105 may extend along a bottom surface of the sacrificial gate pattern 110 to partially cover sidewalls and top surfaces of the active fins AF1 and AF2 and top surfaces of the device isolation patterns ST. The formation of the sacrificial gate structures SG may then be done.

As the sacrificial gate structures SG are formed to run across at least one of the active patterns AP, first and second regions R1 and R2 may be defined in each of the active patterns AP. In this description, the first region R1 may be a portion of each of the active patterns AP that is positioned below one of the sacrificial gate structures SG, and the second regions R2 may be portions of each of the active patterns AP that are positioned on opposite sides of each of the sacrificial gate structures SG. The first region R1 may divide each of the active patterns AP into portions horizontally spaced apart from each other in the second direction D2, which correspond to the second regions R2 on which source/drains are to be formed. First, second, and third parts P1, P2, and P3 may also be defined in the device isolation pattern ST. The first parts P1 may be portions of the device isolation pattern ST that overlaps the sacrificial gate structures SG and are positioned below the sacrificial gate structures SG. The second and third parts P2 and P3 may be other portions of the device isolation pattern ST that are vertically separated by the active patterns AP in the first direction D1. The second parts P2 may be positioned between the first active pattern AP1 and the second active pattern AP2 adjacent to each other, and the third parts P3 may be positioned between the second active pattern AP2 and the third active pattern AP3 adjacent to each other or on sides of outermost active patterns AP1 and AP3 on a pair of the active regions AR1 and AR2, for example. When the sacrificial gate structures SG are formed, the second and third parts P2 and P3 may be recessed on their upper portions. The second and third parts P2 and P3 may thus have top surfaces each of whose profiles is concavely recessed toward the substrate 100. The second and third parts P2 and P3 may have recess depths that are different from each other depending on pattern density of the active patterns AP. For example, the second parts P2 may have upper portions recessed shallower than those of the third parts P3.

Figure 8A:
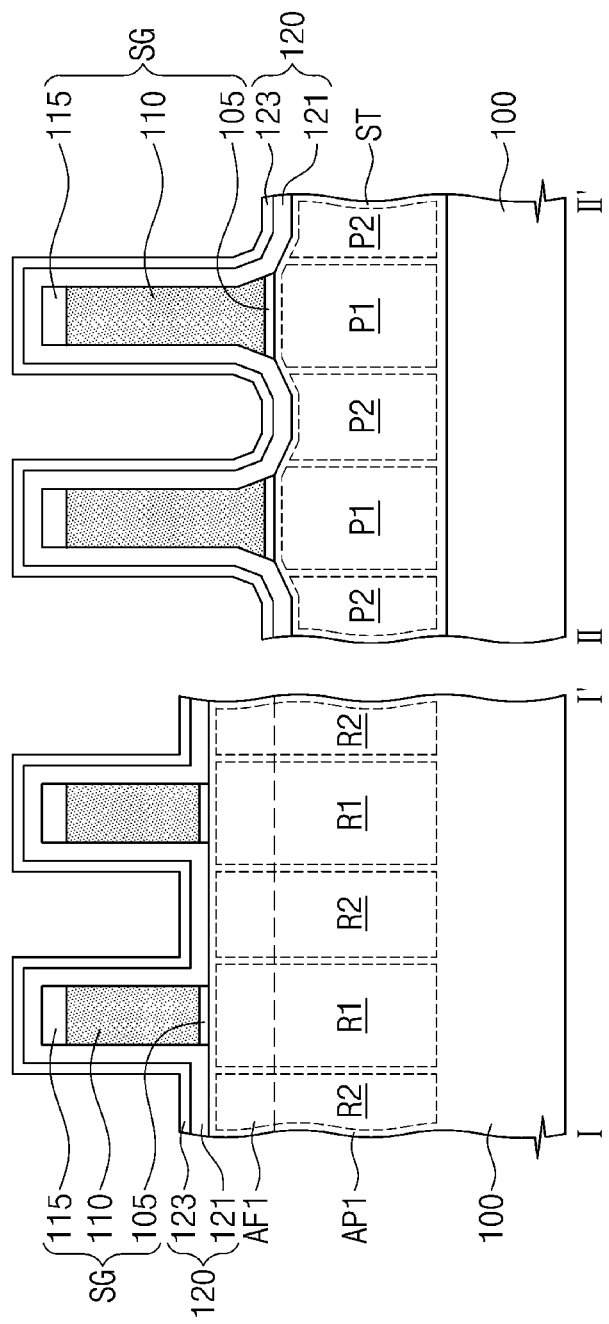
Figure 8B:
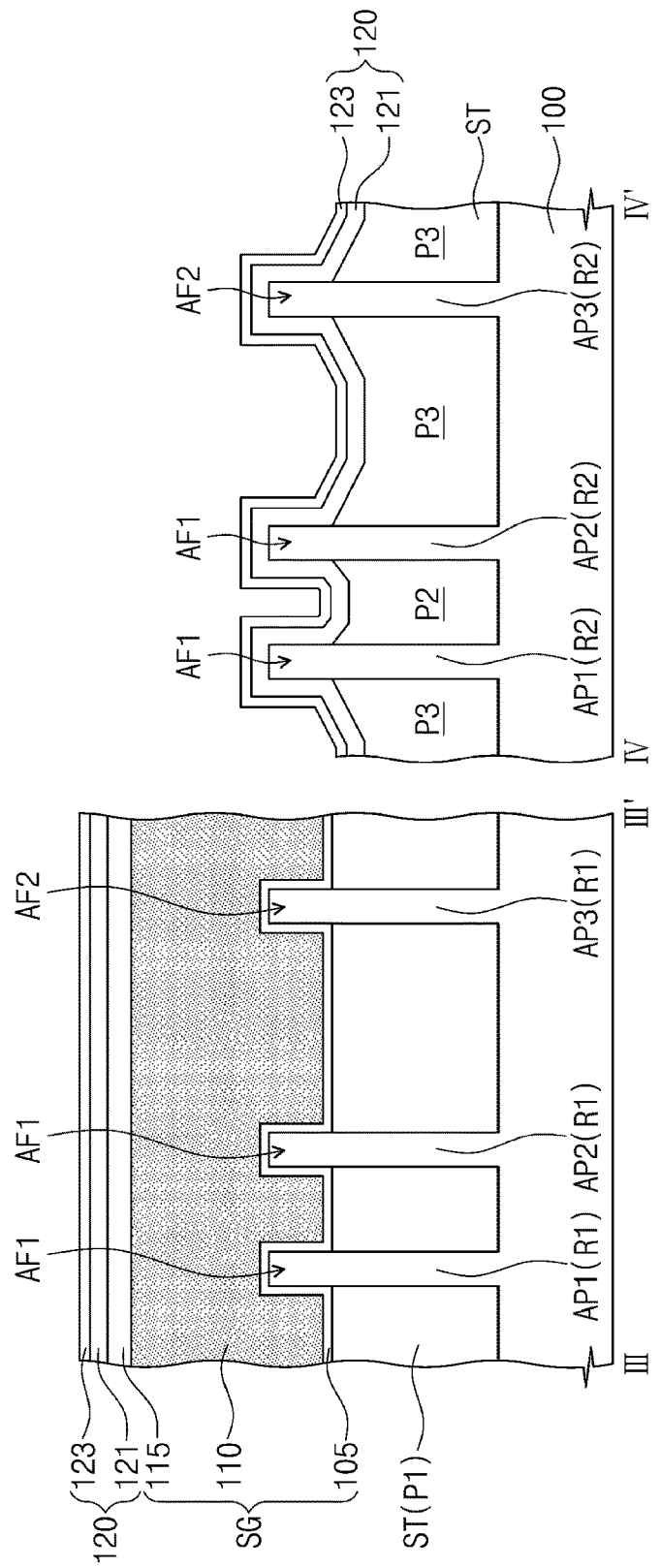

Referring to FIGS. 8A and 8B, a gate spacer layer 120 may be formed on the substrate 100. For example, the gate spacer layer 120 may be formed conformally on the resulting structure of FIGS. 7A and 7B. The gate spacer layer 120 may conformally cover top surfaces and sidewalls of the sacrificial gate structures SG, top surfaces and sidewalls of the second regions R2 exposed through the device isolation pattern ST, and top surfaces of the second and third parts P2 and P3 of the device isolation pattern ST. The gate spacer layer 120 may be formed to have a single layer or a multiple layer. For example, the gate spacer layer 120 may include a first gate spacer layer 121 and a second gate spacer layer 123 that are sequentially stacked. The first gate spacer layer 121 may have a thickness substantially the same as or greater than a thickness of the second gate spacer layer 123. The present inventive concept, however, is not limited thereto. In an exemplary embodiment, the first and second gate spacer layers 121 and 123 may be formed of the same material. For example, the first and second gate spacer layers 121 and 123 may include a silicon nitride layer, a silicon oxynitride layer, or a silicon oxycarbonitride layer. In this case, the gate spacer layer 120 may be formed to have a single layer. In an exemplary embodiment, the first and second gate spacer layers 121 and 123 may be formed of different materials from each other. For example, the first gate spacer layer 121 may include a silicon oxycarbonitride layer, and the second gate spacer layer 123 may include a silicon nitride layer, or vice versa. In this case, the gate spacer layer 120 may be formed to have a double layer. In an exemplary embodiment, the gate spacer layer 120 may be formed to have a triple layer with different materials. The first and second gate spacer layers 121 and 123 may be formed by a deposition process such as an ALD process.

Figure 9A:
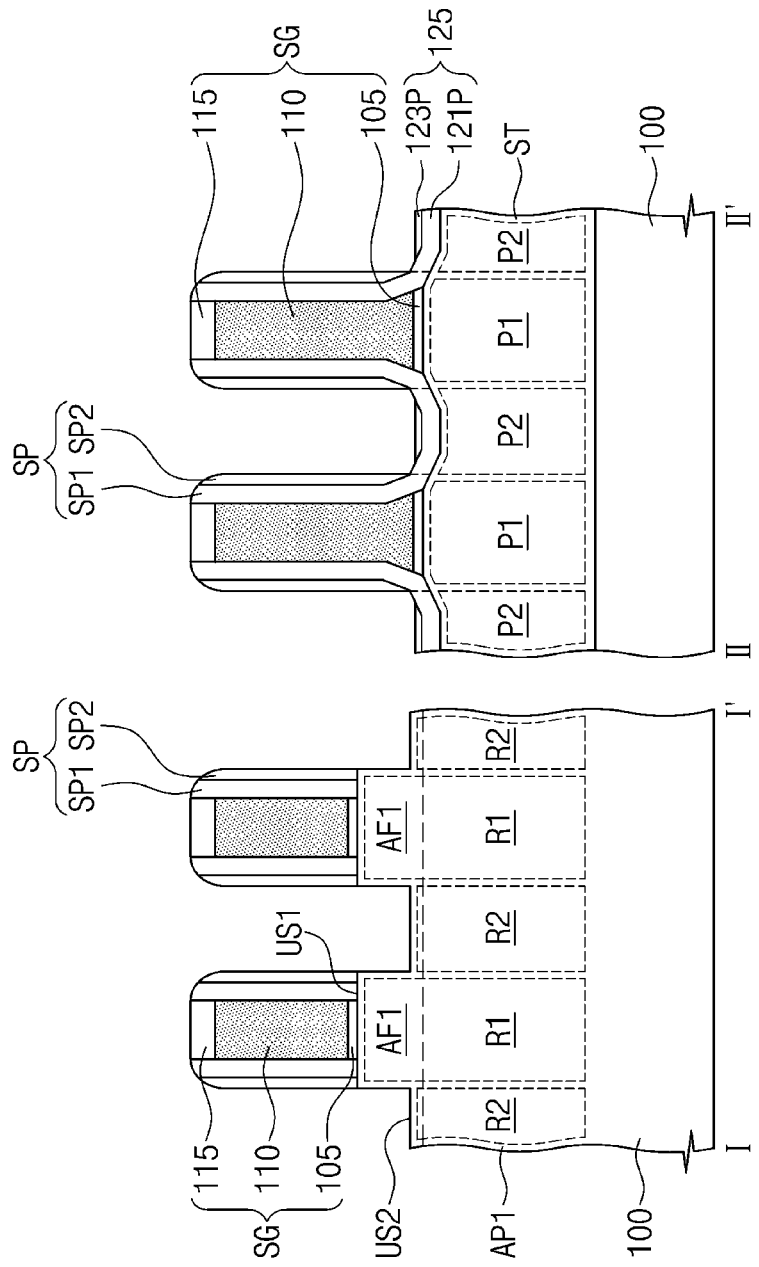
Figure 9B:
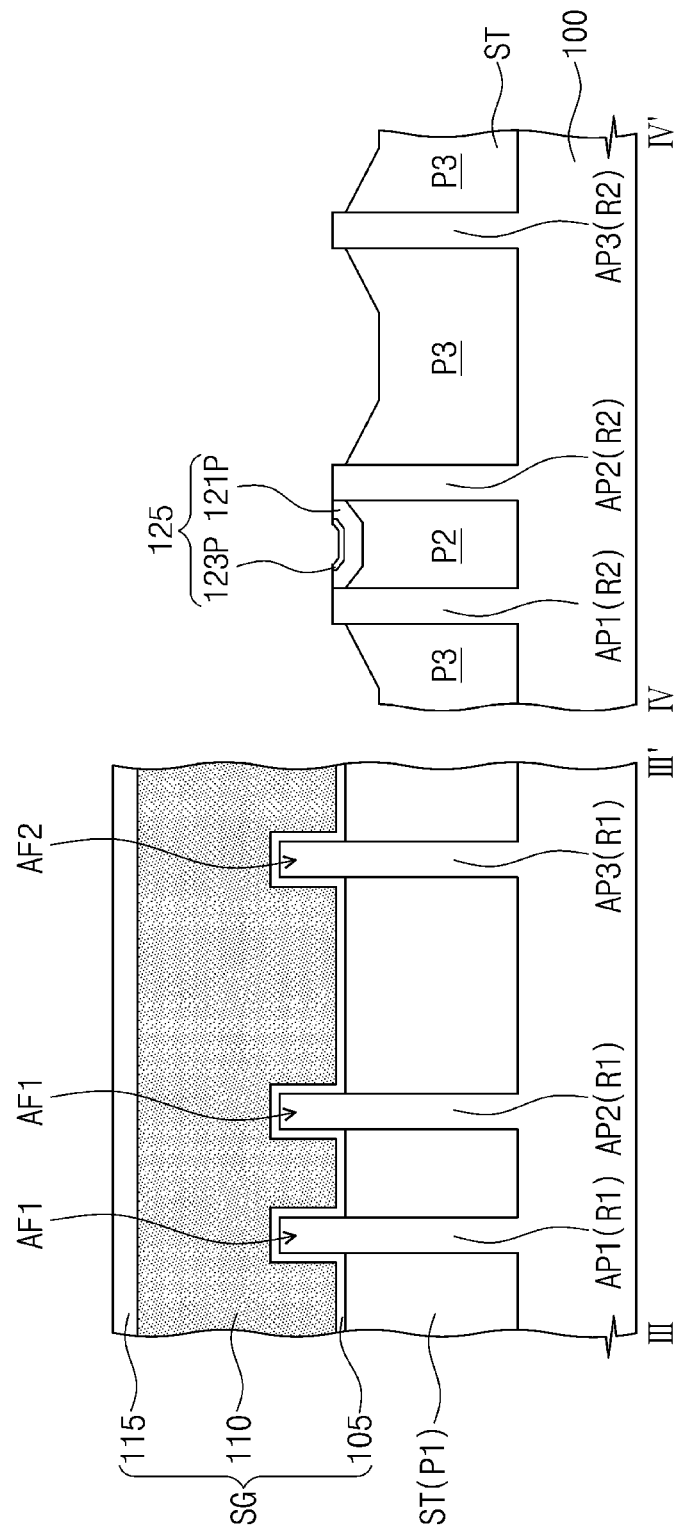

Referring to FIGS. 9A and 9B, a removal may be performed on upper portions of the active patterns AP on opposite sides of each of the sacrificial gate structures SG. For example, the upper portions of the active patterns AP disposed between two adjacent sacrificial gate structures SG may be partially recessed. In this case, the second regions R2 may be recessed on their upper portions. The recessing of the upper portions of the second regions R2 may include performing a dry or wet etching process at least once. The second region R2 may have a recessed top surface US2 lower than a top surface US1 of the first region R1. In an exemplary embodiment, the recessed top surface US2 of the second region R2 may be flat, but the present inventive concept is not limited thereto. For example, the recessed top surface US2 of the second region R2 may have a concavely curved shape toward the substrate 100. The surface US2 of the second region R2 may have a height that is variously changed, as shown in FIG. 4A or 4B, depending on a recess amount.

During the recessing of the upper portions of the second regions R2, the gate spacer layer 120 may be patterned to form gate spacers SP on sidewalls of the sacrificial gate structures SG. In addition, first protective insulation patterns 125 may be formed on the top surface (i.e., the top surfaces of the second parts P2) of the device isolation pattern ST between the two adjacent active patterns AP1 and AP2 and between two adjacent sacrificial gate structures SG. During the recessing the upper portions of the second regions R2, an etching amount of the gate spacer layer 120 may be smaller on a narrow region (having the first distance d1 of FIG. 1) between active patterns (e.g., between the first active pattern AP1 and the second active pattern AP2) than on a wider region (having the second distance d2 of FIG. 1) between the second active pattern AP2 and the third active pattern AP3 adjacent to each other. Accordingly, after the recessing of the second regions R2 is done, the gate spacer layer 120 may be completely removed from the third parts P3 but may remain on the second parts P2 to form the first protective insulation patterns 125. For example, the first protective insulation patterns 125 may be portions of the gate spacer layer 120. The first protective insulation patterns 125 may be connected to the gate spacers SP on the sidewalls of the sacrificial gate structures SG adjacent to the first protective insulation patterns 125. In an exemplary embodiment, each of the first protective insulation patterns 125 may include a first sub-protective insulation pattern 121P and a second sub-protective insulation pattern 123P. The first sub-protective insulation pattern 121P may include the same material as a material of the first gate spacers SP1. The second sub-protective insulation patterns 123P may include the same material as a material of the second gate spacers SP2. In an exemplary embodiment, the first protective insulation pattern 125 may be composed of only the first sub-protective insulation pattern 121P. The first protective insulation patterns 125 may be formed by controlling etch conditions (e.g., etch rate, etch selectivity, etc.) for the gate spacer layer 120 and the active patterns AP or by allowing the gate spacer layer 120 to have a thickness to the extent that a space between the gate spacer layers 120 on facing sidewalls of the two adjacent active patterns AP1 and AP2 is narrow and the gate spacer layers 120, after being etched, may be partially remain in the space to form the first protective insulation patterns 125.

In an exemplary embodiment, the first protective insulation pattern 125 may be in contact with an upper sidewall of the second region R2 that protrudes from the top surface of the device isolation pattern ST. For example, the first protective insulation pattern 125 may be in contact with the upper sidewall of the second region R2 protruding from the top surface of the device isolation pattern ST. The present inventive concept, however, is not limited thereto. A shape of the first protective insulation pattern 125 may be variously changed depending on an etching condition for recessing the gate spacer layer 120 or the upper portions of the second regions R2 or both. In an exemplary embodiment, during recessing of the upper portions of the second regions R2, a portion of the gate spacer layer 120 may remain on the top surfaces of the third parts P3 adjacent to the second regions R2 such that the residual protective insulation patterns 127 may be formed as discussed with reference to FIG. 4C.

Figure 10A:
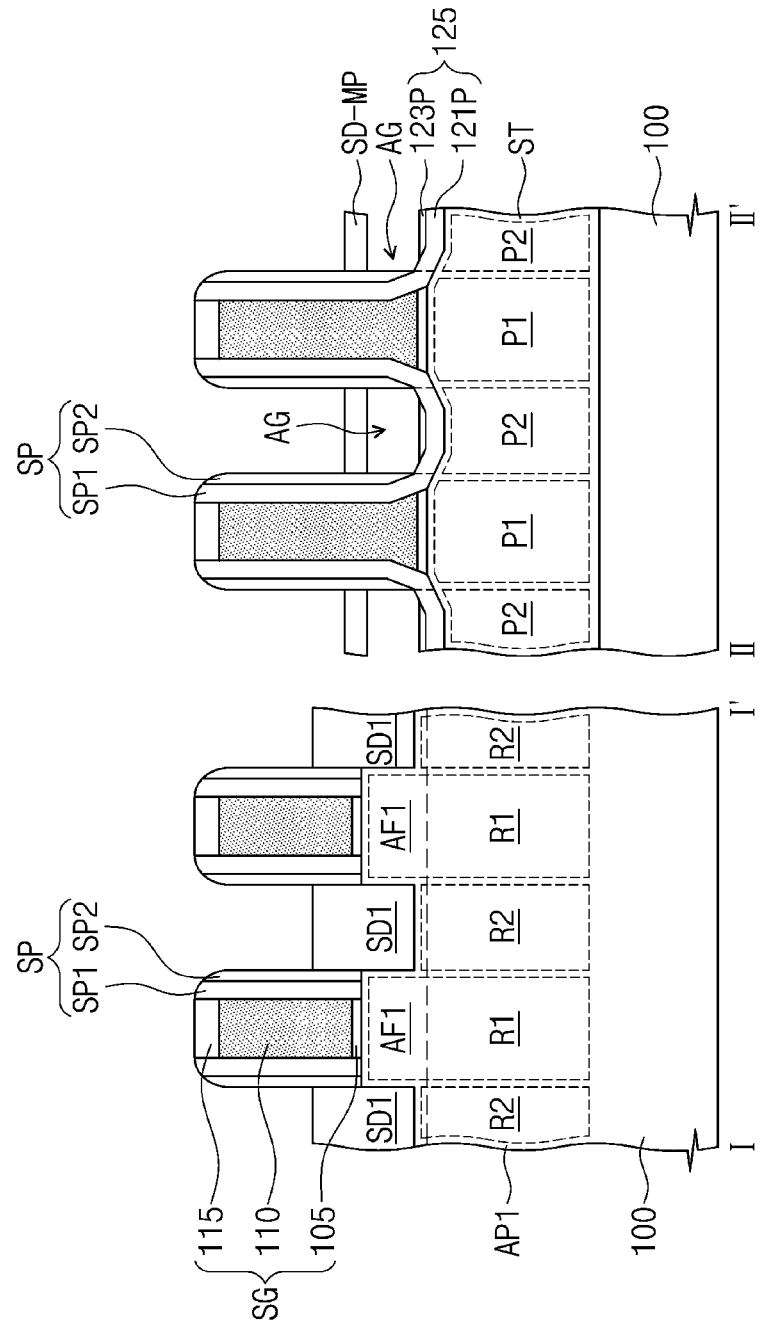
Figure 10B:
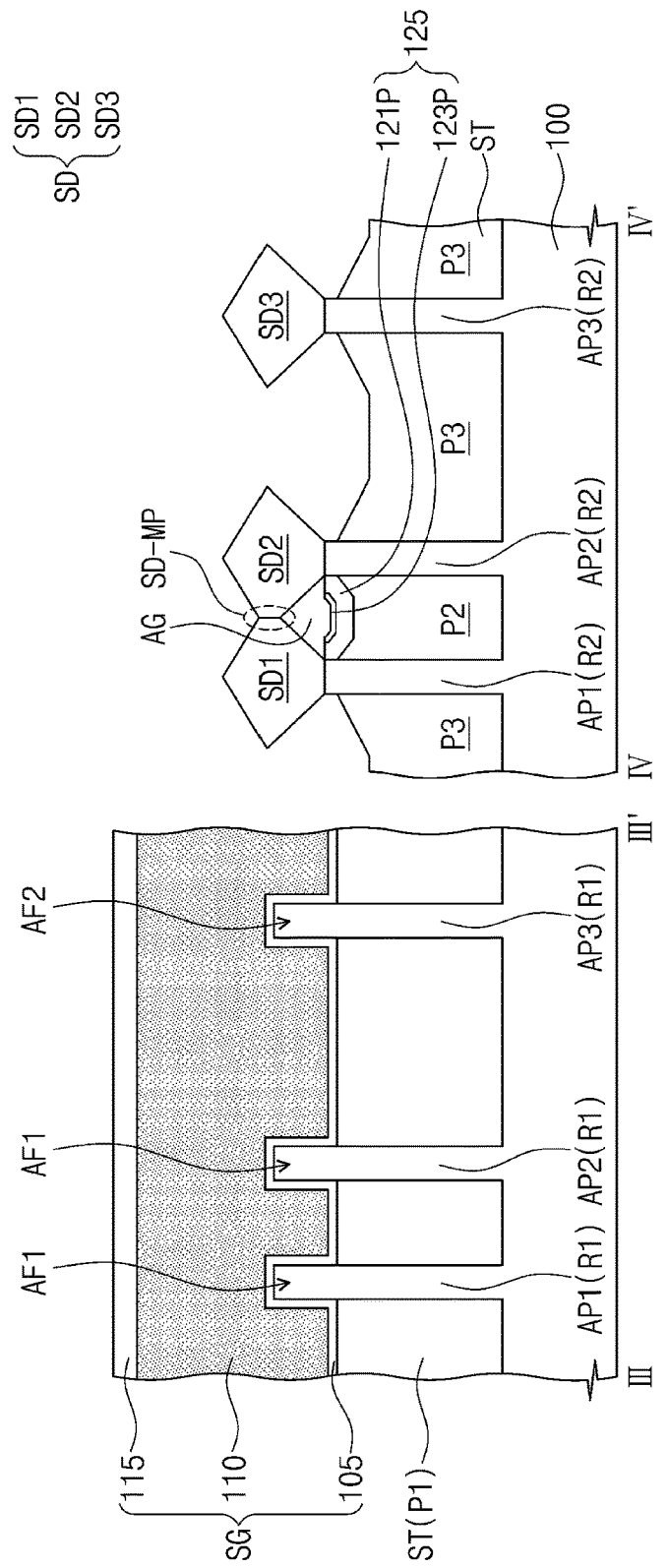

Referring to FIGS. 10A and 10B, source/drain regions may be formed on the active patterns AP (i.e., the second regions R2) on opposite sides of each of the sacrificial gate structures SG. In an exemplary embodiment, a selective epitaxial growth process may be performed to form each of the source/drain regions SD using their underlying active patterns as a seed layer. A first source/drain region SD1 and a second source/drain region SD2 may be formed to induce a tensile strain to the first active fins AF1 interposed therebetween. For example, if the substrate 100 is a silicon substrate, the first and second source/drain regions SD1 and SD2 may be formed of a Si or SiC layer. Third source/drain region SD3 may be formed to induce a compressive strain to the second active fins AF2 interposed therebetween. For example, when the substrate 100 is a silicon substrate, the third source/drain region SD3 may be formed of a SiGe layer. Simultaneously with or after the epitaxial growth process, the source/drain regions SD may be doped with an impurity. The first and second source/drain regions SD1 and SD2 may be doped with an n-type impurity, and the third source/drain region SD3 may be doped with a p-type impurity. The source/drain regions SD may rise up (or be elevated) from a top surface of the first region R1.

As viewed in cross-section taken along the first direction D1, the source/drain regions SD may have their sidewalls each having a laterally sharp wedge shape. For example, each of the source/drain regions SD may have a sidewall including a lower sidewall substantially negatively inclined to the top surface of the substrate 100 and an upper sidewall substantially positively inclined to the top surface of the substrate 100. In an exemplary embodiment, the first and second source/drain regions SD1 and SD2 adjacent to each other may have facingly connected sidewalls. In this case, an air gap AG may be formed below the sidewalls of the first and second source/drain regions SD1 and SD2. For example, two adjacent first and second source/drain regions SD1 and SD2 may be in contact with each other to the extent that the air gap AG has a top surface defined by the lower sidewalls of the two adjacent first and second source/drain regions SD1 and SD2. The air gap AG may have a bottom surface defined by the first protective insulation pattern 125. The present inventive concept, however, is not limited thereto. For example, as shown in FIG. 4D, two adjacent first and second source/drain regions SD1 and SD2 adjacent to each other may have their sidewalls that are spaced apart at a third distance d3. The spacing at the third distance d3 between the sidewalls of the first and second source/drain regions SD1 and SD2 may be filled with a capping insulation layer 130 which will be discussed below. In this case, the air gap AG may be formed below the adjacent first and second source/drain regions SD1 and SD2. An upper surface of the air gap AG may be defined by the lower sidewalls of the two adjacent first and second source/drain regions SD1 and SD2 spaced apart from each other at the third distance d3 and the capping insulation layer 130, as shown in FIG. 4D.

The two adjacent first and second source/drain regions SD1 may be merged to each over on the second part P2 of the device isolation pattern ST to form a merged source/drain part SD-MP.

Figure 11A:
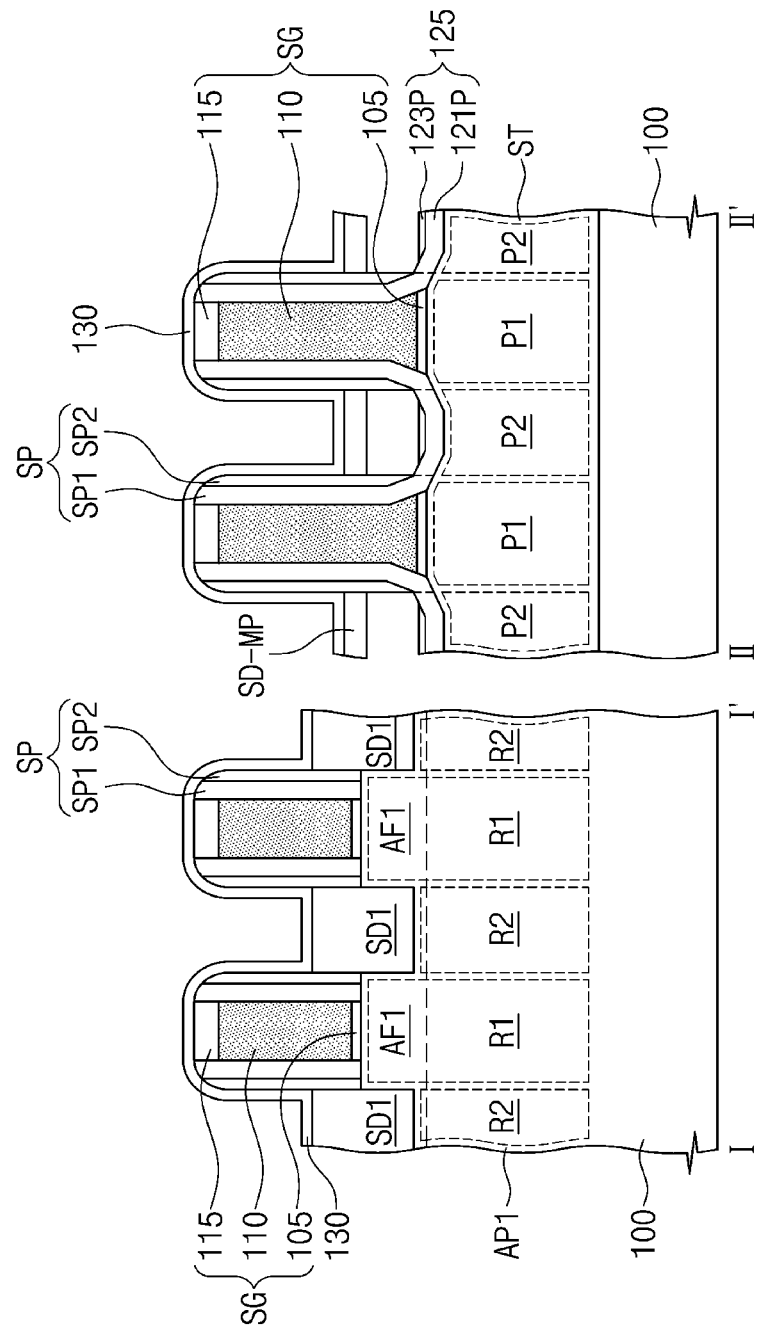
Figure 11B:
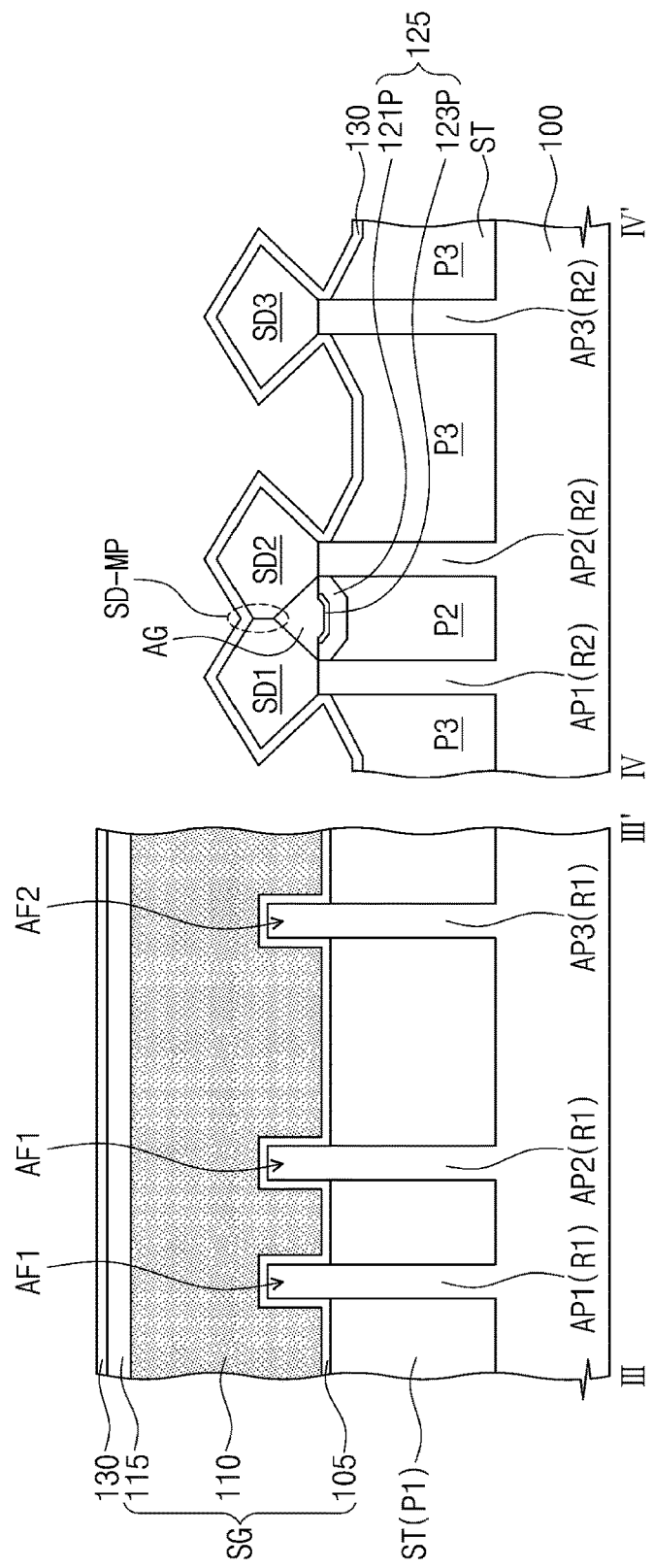

Referring to FIGS. 11A and 11B, the capping insulation layer 130 may be formed on the substrate 100. For example, the capping insulation layer 130 may be formed conformally on the resulting structure of FIGS. 10A and 10B. The capping insulation layer 130 may conformally cover the top surfaces of the third parts P3 of the device isolation pattern ST and extend onto the source/drain regions SD and the gate mask pattern 115. The capping insulation layer 130 may be formed of a material having etch selectivity with respect to a first interlayer dielectric layer 140 which will be discussed below with respect to FIGS. 12A and 12B. For example, the capping insulation layer 130 may include a silicon nitride layer or a silicon oxynitride layer. The capping insulation layer 130 may be formed by a CVD process or an ALD process.

Figure 12A:
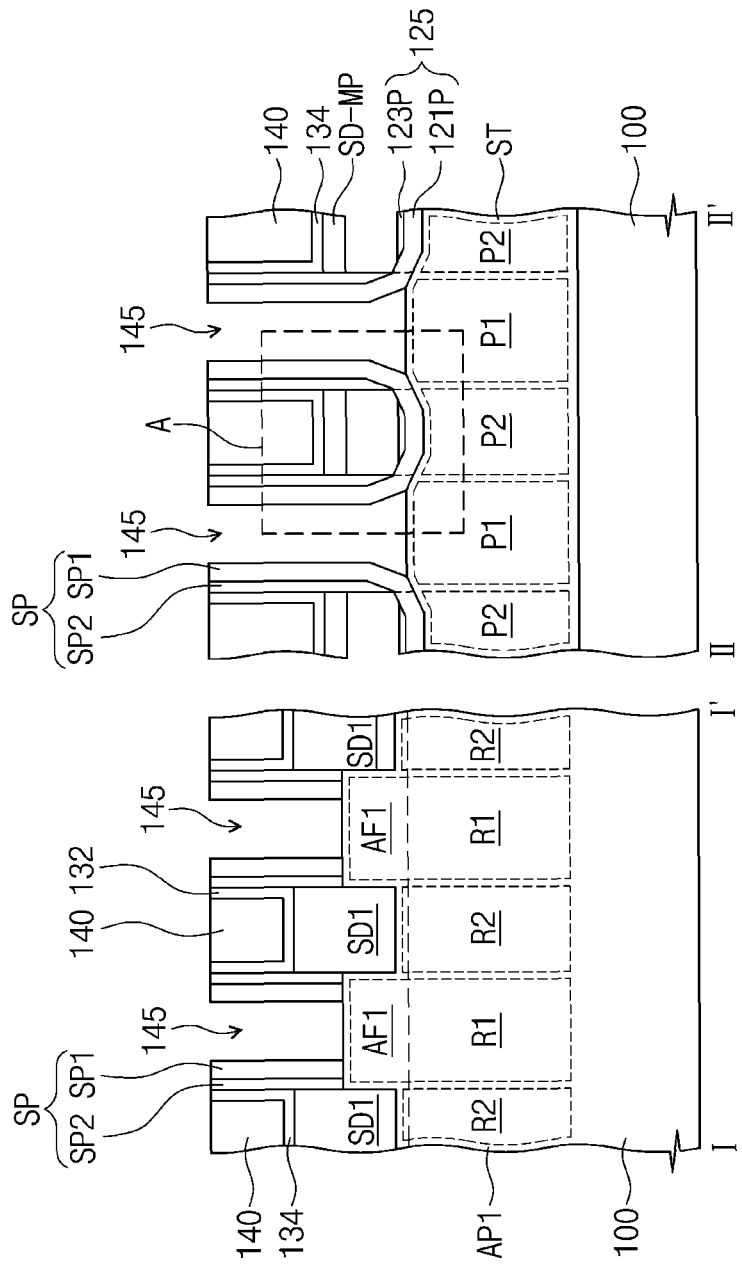
Figure 12B:
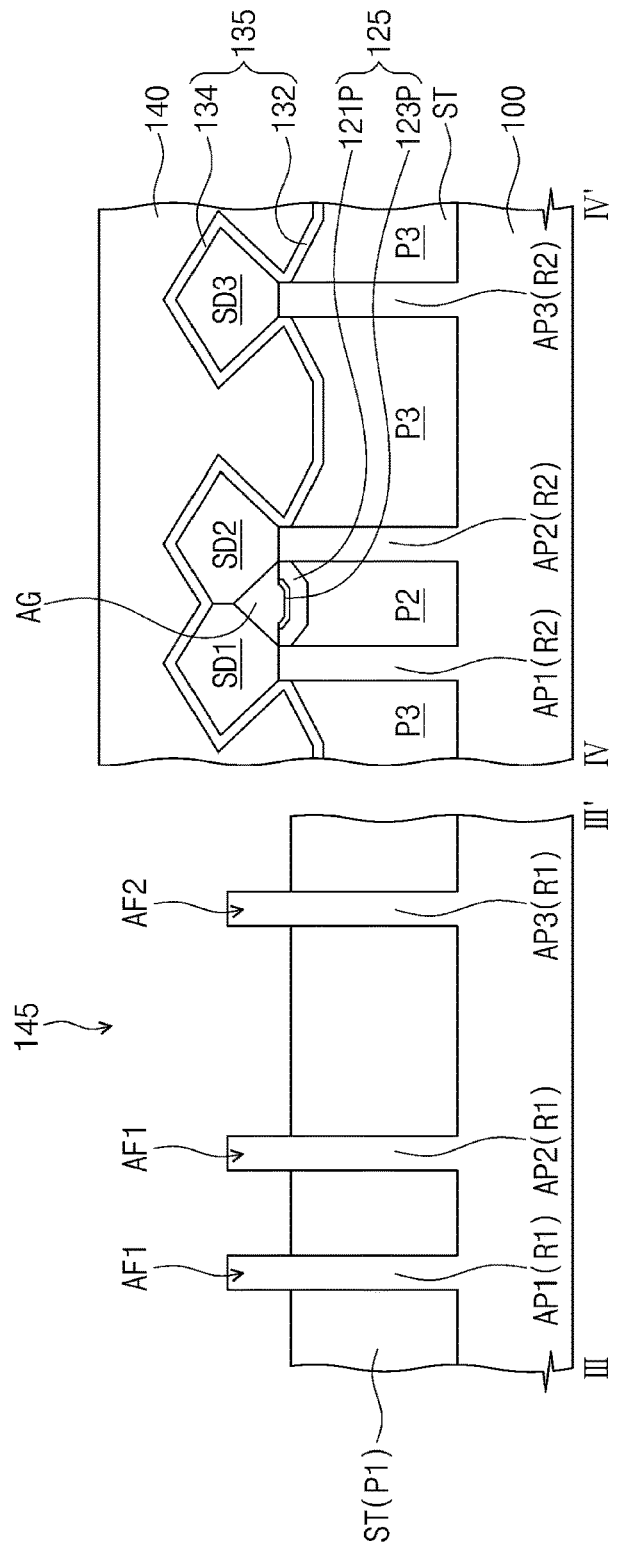

Referring to FIGS. 12A and 12B, the first interlayer dielectric layer 140 may be formed on the substrate 100. For example, the first interlayer dielectric layer 140 may be formed on the resulting structure of FIGS. 11A and 11B. The first interlayer dielectric layer 140 may be formed to cover the source/drain regions SD and the sacrificial gate structures SG. The first interlayer dielectric layer 140 may include one or more of a silicon oxide layer and a low-k dielectric layer.

After the first interlayer dielectric layer 140 is formed, the gate mask pattern 115, the sacrificial gate pattern 110, and the etch stop pattern 105 may be removed so that a gap region 145 may be formed between the gate spacers SP. The gap region 145 may expose the active fins AF1 and AF2 and top surfaces of the first parts P1. During an etch process for removing the gate mask pattern 115, the first interlayer dielectric layer 140 and the gate spacers SP may be partially etched. The gap region 145 may be formed by performing an etching process that partially etches the sacrificial gate pattern 110 and the etch stop pattern 105. During the formation of the gap region 145, the gate spacer SP may be partially etched on its sidewall exposed to the gap region 145.

As shown in FIG. 15, comparative example without the first protective insulation pattern 125 with respect to the present inventive concept, a void VD is present in an upper portion of the device isolation pattern ST below the gap region 145, and an etchant may permeate through the void VD into the device isolation pattern ST. The etchant permeated into the device isolation pattern ST may flow into the air gap AG and then etch the first source/drain region SD1 exposed to the air gap AG (see arrow 147). However, according to an exemplary embodiment of the present inventive concept, the first protective insulation pattern 125 may be formed on the top surface of the second part P2 of the device isolation pattern ST below the first source/drain region SD1, and the first protective insulation pattern 125 may prevent the etchant permeated through the void VD from flowing into the air gap AG during the formation of the gap region 145 (see arrow 146 of FIG. 14). It thus may be possible to prevent etching damage to the merged source/drain part SD-MP of the first and second source/drain regions SD1 and SD2 and also prevent an electrical short between the first source/drain region D1 and a gate electrode GE which will be formed later. In an exemplary embodiment, the merged source/drain part SD-MP may be disposed on the air gap AG. As a result, a semiconductor device may have increased electrical characteristics and reliability.

Meanwhile, during the formation of the gap region 145, the capping insulation layer 130 on the gate mask pattern 115 may be partially removed to form a capping insulation pattern 135. The capping insulation pattern 135 may have portions, which cover the top surfaces of the third parts P3 of the device isolation pattern ST, defined as second protective insulation patterns 132 and also have other portions, which cover sidewalls of the gate spacer SP and the source/drain regions SD, defined as contact etch stop patterns 134. As the second protective insulation patterns 132 are formed on the top surfaces of the third parts P3 of the device isolation pattern ST, it may prevent etchant permeation occurred during the formation of the gap region 145.

Figure 13A:
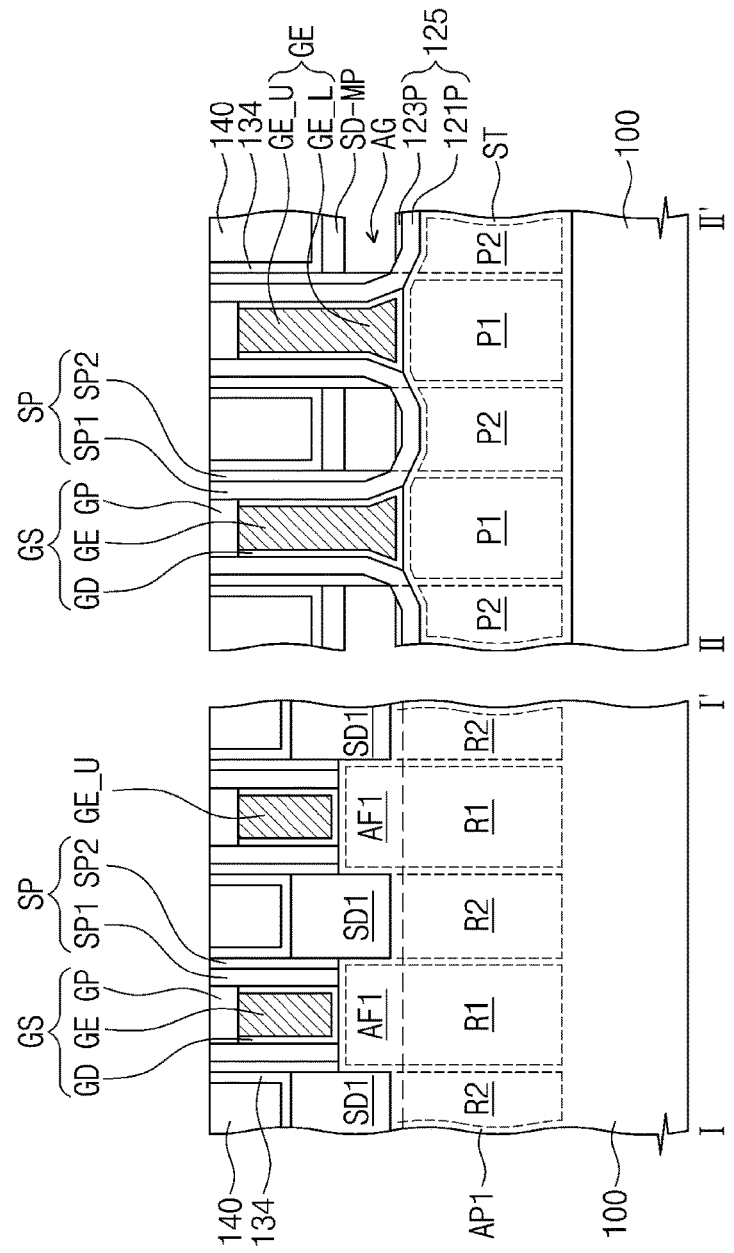
Figure 13B:
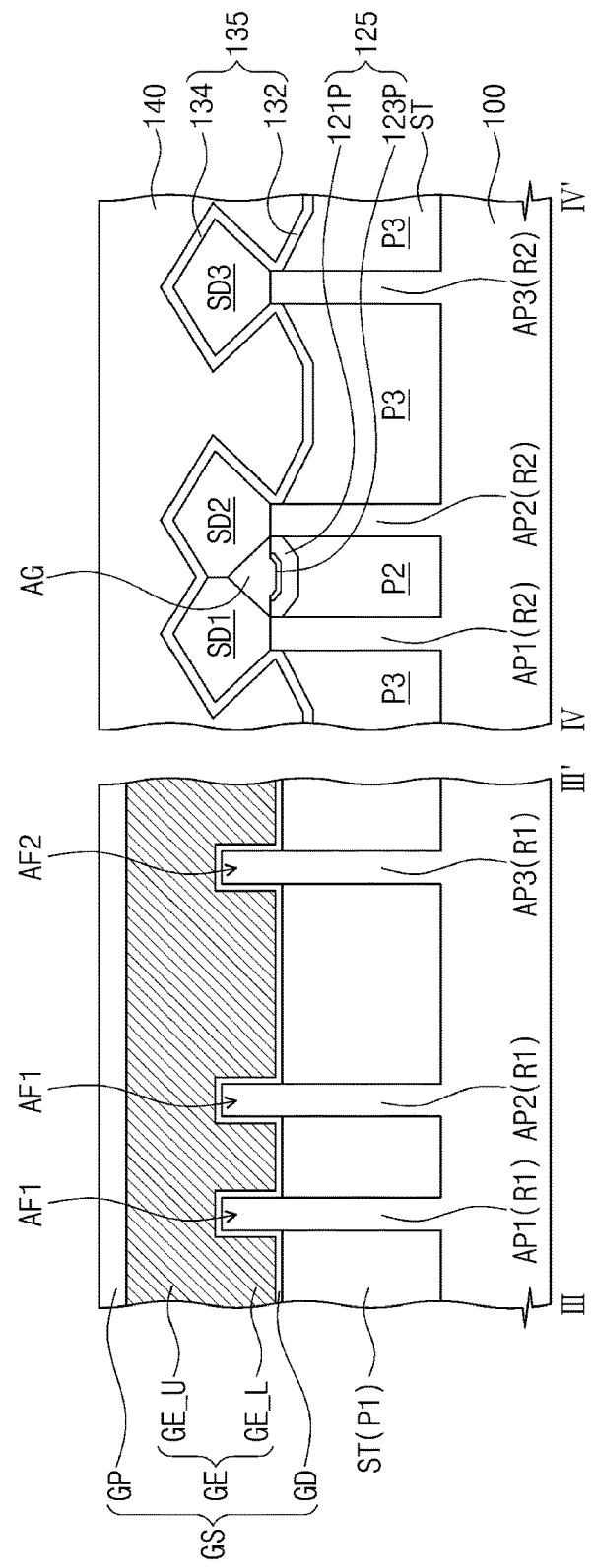

Referring to FIGS. 13A and 13B, a gate dielectric pattern GD and a gate electrode GE may be formed to fill the gap region 145. First, a gate dielectric layer may be formed on the substrate 100 to partially fill the gap region 145. The gap dielectric layer may be formed to cover the active fins AF1 and AF2 and the top surfaces of the first parts P1. The gate dielectric layer may include at least one of high-k dielectric layers. For example, the gate dielectric layer may include one or more of hafnium oxide, hafnium silicate, zirconium oxide, and zirconium silicate, but the present inventive concept is not limited to these materials. The gate dielectric layer may be formed by performing, for example, an ALD process or a CVD process. A gate layer may be formed on the gate dielectric layer to fill a remaining portion of the gap region 145. The gate layer may include one or more of metal nitride (e.g., titanium nitride, tantalum nitride, or tungsten nitride) and metal (e.g., aluminum or tungsten). A planarization process may be performed on the gate dielectric layer and the gate layer that are sequentially stacked, and thus the gate dielectric pattern GD and the gate electrode GE may be formed within the gap region 145. The planarization process may expose top surfaces of the first interlayer dielectric layer 140 and the gate spacers SP. The gate dielectric pattern GD may extend along a bottom surface of the gate electrode GE and toward opposite sidewalls of the gate electrode GE to interpose between the gate electrode GE and each of the gate spacers SP.

The gate electrode GE may be recessed on its upper portion. During the recessing the upper portion of the gate electrode GE, an upper portion of the gate dielectric pattern GD may also be removed. A gate capping pattern GP may be formed in a space where the gate electrode GE and the gate dielectric pattern GD are removed. The gate capping pattern GP may include, for example, silicon nitride. A gate structure GS may be defined to include the gate dielectric pattern GD, the gate electrode GE, and the gate capping pattern GP.

Referring back to FIGS. 2A and 2B, a second interlayer dielectric layer 150 may be formed on the substrate 100 on which the gate structure GS is formed. The second interlayer dielectric layer 150 may include silicon oxide, silicon nitride, or silicon oxynitride. Contact holes may be formed to penetrate the second interlayer dielectric layer 150, the first interlayer dielectric layer 140, and the contact etch stop patterns 134 in such a way that the first and second source/drain regions SD are exposed through the contact holes. Upper portions of the source/drain regions SD may be partially removed by an etching process for forming the contact holes. Subsequently, the contact holes may be filled with a conductive material to form source/drain contacts 160a and 160b.

As not shown in figures, the second interlayer dielectric layer 150 may be provided thereon with routing lines (not shown) coupled to the source/drain contacts 160a and 160b. The routing lines (not shown) may be configured to provide the source/drain regions SD with voltage through the source/drain contacts 160a and 160b.

According to an exemplary embodiment of the present inventive concept, protective insulation patterns may be provided on a device isolation pattern between active patterns. The protective insulation patterns may prevent a source/drain region from being etched by an etchant, which permeates into the device isolation pattern and flows into an air gap below the source/drain region, during forming a gate electrode. It may also be possible to prevent an electrical short between the gate electrode and the source/drain region by blocking an outflow of a gate electrode material through an etchant permeation path. As a result, a semiconductor device may have enhanced electrical characteristics and reliability.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a plurality of active patterns protruding from a substrate, wherein the plurality of active patterns includes a first active pattern, a second active pattern spaced apart from the first active pattern at a first distance, and a third active pattern spaced apart from the second active pattern at a second distance greater than the first distance;
a gate electrode running across the plurality of active patterns;
a gate spacer on a sidewall of the gate electrode;
a plurality of source/drain regions including a first source/drain region, a second source/drain region and a third source/drain region, each of the plurality of source/drain regions being disposed on a region of one of the plurality of active patterns,
wherein the region of one of the plurality of active patterns is disposed adjacent to a side of the gate electrode;
a first protective insulation pattern disposed on the substrate between the first and second active patterns and below the first and second source/drain regions; and
a second protective insulation pattern disposed on the substrate between the second and third active patterns and below the second and third source/drain regions.

2. The semiconductor device of claim 1,
wherein the first protective insulation pattern has a first thickness, and
wherein the second protective insulation pattern has a second thickness less than the first thickness.

3. The semiconductor device of claim 1, further comprising:
a plurality of contact etch stop patterns each covering a sidewall of one of the plurality of source/drain regions,
wherein the first protective insulation pattern is connected to the gate spacer, and
wherein the second protective insulation pattern is connected to one of the plurality of contact etch stop patterns.

4. The semiconductor device of claim 3,
wherein the first protective insulation pattern comprises the same material as a material of the gate spacer, and
wherein the second protective insulation pattern comprises the same material as a material of each of the plurality of contact etch stop patterns.

5. The semiconductor device of claim 1,
wherein facing sidewalls of the first source/drain region and the second source/drain region are in contact to each other so that an air gap is disposed in a space defined by the facing sidewalls of the first source/drain region and the second source/drain region, and
wherein the first protective insulation pattern is disposed under the space so that the air gap includes a bottom surface defined by the first protective insulation pattern.

6. The semiconductor device of claim 1,
wherein the gate spacer comprises a first gate spacer and a second gate spacer that are sequentially disposed on the sidewall of the gate electrode, and
wherein the first gate spacer and the second gate spacer include different materials from each other.

7. The semiconductor device of claim 6,
wherein the first protective insulation pattern comprises a first sub-protective insulation pattern and a second sub-protective insulation pattern that are sequentially stacked on the substrate,
wherein the first sub-protective insulation pattern includes the same material as a material of the first gate spacer, and
wherein the second sub-protective insulation pattern includes the same material as a material of the second gate spacer.

8. The semiconductor device of claim 1, further comprising:
a first source/drain contact connected in common to the first source/drain region and the second source/drain region; and
a second source/drain contact connected to the third source/drain region.

9. A semiconductor device, comprising:
a substrate having a device isolation pattern;
a pair of a first active pattern and a second active pattern protruding from the device isolation pattern of the substrate and spaced apart at a first distance from each other in a first direction;
a pair of gate electrodes running across the pair of the first active pattern and the second active pattern and spaced apart from each other in a second direction crossing the first direction;
a third active pattern protruding from the device isolation pattern of the substrate and spaced apart at a second distance from the second active pattern adjacent to the third active pattern, the second distance being greater than the first distance;
a pair of gate spacers disposed on facing sidewalls of the pair of gate electrodes, respectively;
a pair of source/drain regions on the pair of the first active pattern and the second active pattern, respectively, between one of the pair of gate electrodes and the other of the pair of gate electrodes;
a first protective insulation pattern on the device isolation pattern between the pair of gate electrodes and between the pair of the first active pattern and the second active pattern; and
a second protective insulation pattern on the device isolation pattern between the second active pattern and the third active pattern.

10. The semiconductor device of claim 9,
wherein the first protective insulation pattern has a first thickness, and
wherein the second protective insulation pattern has a second thickness less than the first thickness.

11. The semiconductor device of claim 9, further comprising:
a contact etch stop pattern covering the pair of source/drain regions,
wherein the first protective insulation pattern is connected to a lower end of each of the pair of gate spacers so that a connected structure of the first protective insulation pattern and the pair of gate spacers is of U-shaped,
wherein the second protective insulation pattern is connected to the contact etch stop pattern, and
wherein the first protective insulation pattern and the second protective insulation pattern are in contact with the device isolation pattern.

12. The semiconductor device of claim 11,
wherein one of the pair of source/drain regions and the other of the pair of source/drain regions are in contact to each other so that an air gap has a top surface defined by facing sidewalls of the pair of source/drain regions, and
wherein the air gap has a bottom surface defined by the first protective insulation pattern.

13. The semiconductor device of claim 9,
wherein each of the pair of gate spacers comprises a first gate spacer and a second gate spacer that are sequentially disposed on a corresponding one of the facing sidewalls of the pair of gate electrodes, wherein the first protective insulation pattern comprises a first sub-protective insulation pattern and a second sub-protective insulation pattern that are sequentially stacked on the device isolation pattern, and wherein the first sub-protective insulation pattern includes the same material as a material of the first gate spacer, and the second sub-protective insulation pattern includes the same material as a material of the second gate spacer.

14. A semiconductor device, comprising:

a device isolation pattern disposed on a substrate, wherein the device isolation pattern includes a first part, a second part and a third part;

a first active pattern protruding from the device isolation pattern;

a second active pattern adjacent to the first active pattern in a first direction and protruding from the device isolation pattern;

a first gate structure disposed on the substrate;

a second gate structure adjacent to the first gate structure in a second direction crossing the first direction, wherein each of the first active pattern and the second active pattern includes a first region and a second region, wherein the first gate structure and the second gate structure run across the first region of each of the first active pattern and the second active pattern and the first part of the device isolation pattern, and wherein the second region of each of the first active pattern and the second active pattern is adjacent to the first region of each of the first active pattern and the second active pattern; and a U-shaped structure including a left gate spacer and a right gate spacer disposed on a sidewall of the first gate structure and a sidewall of the second gate structure, respectively, wherein the U-shaped structure further includes a first protective insulation pattern being in contact with a second part of the device isolation pattern between the first active pattern and the second active pattern and between the first gate structure and the second gate structure.

15. The semiconductor device of claim 14, further comprising:

a third active pattern adjacent to the second active pattern in the first direction; and a second protective insulation pattern being in contact with a third part of the device isolation pattern between the second active pattern and the third active pattern.

16. The semiconductor device of claim 15, wherein the first active pattern and the second active pattern are spaced apart from each other at a first distance, and wherein the second active pattern and the third active pattern are spaced apart from each other at a second distance different from the first distance.

17. The semiconductor device of claim 15, wherein the first active pattern, the second active pattern and the third active pattern are of the same conductivity type.

18. The semiconductor device of claim 14, further comprising:

an air gap disposed within the U-shaped structure; and a pair of source/drain regions, wherein one of the pair of source/drain regions is disposed on the second region of the first active pattern and the other of the pair of source/drain regions is disposed on the second region of the second active pattern.

19. The semiconductor device of claim 18, wherein a sidewall of the first active pattern is in contact with a sidewall of the second active pattern to form a merged source/drain part of the first active pattern and the second active pattern, and wherein the air gap is defined by the merged source/drain part of the first active pattern and the second active pattern, the left gate spacer, the right gate spacer and the first protective insulation pattern.

20. The semiconductor device of claim 14, wherein each of the left gate spacer and the right gate spacer includes a first spacer and a second spacer, wherein the first protective insulation pattern includes a first sub-protective insulation pattern and a second sub-protective insulation pattern that are sequentially stacked on the device isolation pattern, wherein the first sub-protective insulation pattern is connected to a lower end of the first spacer of the left gate spacer and a lower end of the first spacer of the right gate spacer, wherein the second sub-protective insulation pattern is separated from the second spacer of each of the left gate spacer and the right gate spacer.

* * * * *